US006847547B2

(12) United States Patent
Albert et al.

(10) Patent No.: US 6,847,547 B2
(45) Date of Patent: Jan. 25, 2005

(54) MAGNETOSTATICALLY COUPLED MAGNETIC ELEMENTS UTILIZING SPIN TRANSFER AND AN MRAM DEVICE USING THE MAGNETIC ELEMENT

(75) Inventors: Frank Albert, Redwood City, CA (US); Yiming Huai, Pleasanton, CA (US); Paul P. Nguyen, San Jose, CA (US)

(73) Assignee: Grandis, Inc., Milpitas, CA (US)

( * ) Notice: Subject to any disclaimer, the term of this patent is extended or adjusted under 35 U.S.C. 154(b) by 100 days.

(21) Appl. No.: 10/377,689

(22) Filed: Feb. 28, 2003

(65) Prior Publication Data

US 2004/0170055 A1 Sep. 2, 2004

(51) Int. Cl.$^7$ .............................................. G11C 11/15
(52) U.S. Cl. ...................... 365/173; 365/171
(58) Field of Search ......................... 365/173, 171, 365/158

(56) References Cited

U.S. PATENT DOCUMENTS

| | | | | |
|---|---|---|---|---|
| 5,764,567 | A | * | 6/1998 | Parkin ......................... 365/173 |
| 6,418,048 | B1 | * | 7/2002 | Sin et al. .................... 365/173 |
| 6,473,337 | B1 | * | 10/2002 | Tran et al. ................... 365/173 |
| 6,532,164 | B2 | | 3/2003 | Redon et al. ................. 365/97 |
| 6,714,444 | B2 | * | 3/2004 | Huai et al. ................... 365/171 |
| 2002/0105827 | A1 | | 8/2002 | Redon et al. ................. 365/173 |
| 2003/0007398 | A1 | | 1/2003 | Daughton et al. | |
| 2003/0059588 | A1 | | 3/2003 | Hannah et al. ............. 428/200 |

OTHER PUBLICATIONS

J.F. Albert, et al, "Polarized Current Switching of a CO Thin Film Nanomagnet", American Institute of Physics, vol. 77, No. 23, Dec. 4, 2000, pp. 3809–3811.

J.A. Katine, et al, "Current–Driven Magnetization Reversal and Spin–Wave Excitations in Co/Cu/Co Pillars", the American Physical Society, vol. 84, No. 14, Apr. 3, 2000, pp. 3149–3151.

E.G. Myers, et al, "Point–Contact Studies of Current–Controlled Domain Switching in Magnetic Multilayers" Journal of Applied Physics, vol. 87, No. 9, May 1, 2000, pp. 5502–5503.

J.C. Slonczewski, "Theory and Application of Exchange–Driven Switching", IEEE, Apr. 2000, pp. CE–02.

J.C. Slonczewski, "Current–Driven Excitation of Magnetic Multilayers", Journal of Magnetism and Magnetic Materials, 1996, pp. 1.1–1.7.

J.C. Slonczewski, "Conductance and Exchange Coupling of Two Ferromagnets Separated by a Tunneling Barrier", The American Physical Society, vol. 39, No. 10, Apr. 1, 1999, pp. 6995–7002.

J.Z. Sun, "Current–Driven Magnetic Switching in Manganite Trilayer Junctions", Journal of Magnetism and Magnetic Materials, No. 202, 1999, pp. 157–162.

* cited by examiner

*Primary Examiner*—Anh Phung
(74) *Attorney, Agent, or Firm*—Sawyer Law Group LLP

(57) ABSTRACT

A method and system for providing a magnetic element and a corresponding memory are disclosed. In one aspect, the method and system include providing a dual spin tunnel/valve structure and at least one spin valve. The dual spin tunnel/valve structure includes a nonmagnetic spacer layer between a pinned layer and a free layer, another pinned layer and a barrier layer between the free layer and the other pinned layer. The free layers of the dual spin tunnel/valve structure and the spin valve are magnetostatically coupled. In one embodiment a separation layer resides between the dual spin tunnel/valve structure and the spin valve. In another aspect, the method and system include providing two dual spin valves, a spin tunneling junction there between and, in one embodiment, the separation layer. In both aspects, the magnetic element is configured to write to the free layers using spin transfer when a write current is passed through the magnetic element.

33 Claims, 13 Drawing Sheets

MAGNETOSTATICALLY COUPLED MAGNETIC ELEMENTS UTILIZING SPIN TRANSFER AND AN MRAM DEVICE USING THE MAGNETIC ELEMENT

FIELD OF THE INVENTION

The present invention relates to magnetic memory systems, and more particularly to a method and system for providing an element that employs a spin transfer effect in switching and that can be used in a magnetic memory such as magnetic random access memory ("MRAM").

BACKGROUND OF THE INVENTION

Magnetic memories are often used in storing data. One type of memory element currently of interest utilizes magnetoresistance of a magnetic element for storing data. FIGS. 1A and 1B depict conventional magnetic elements 1 and 1'. The conventional magnetic element 1 is a spin valve 1 and includes a conventional antiferromagnetic layer 2, a conventional pinned layer 4, a conventional nonmagnetic spacer layer 6 and a conventional free layer 8. The conventional pinned layer 4 and the conventional free layer 8 are ferromagnetic. The conventional nonmagnetic spacer layer 6 is nonmagnetic. The conventional nonmagnetic spacer layer 6 is conductive. The antiferromagnetic layer 2 is used to fix, or pin, the magnetization of the pinned layer 4 in a particular direction. The magnetization of the free layer 8 is free to rotate, typically in response to an external magnetic field.

The conventional magnetic element 1' is a spin tunneling junction. Portions of the conventional spin tunneling junction 1' are analogous to the conventional spin valve 1. Thus, the conventional magnetic element 1' includes an antiferromagnetic layer 2', a conventional pinned layer 4', an insulating barrier layer 6' and a free layer 8'. The conventional barrier layer 6' is thin enough for electrons to tunnel through in a conventional spin tunneling junction 1'.

Depending upon the orientations of the magnetizations of the free layer 8 or 8' and the pinned layer 4 or 4', respectively, the resistance of the conventional magnetic element 1 or 1', respectively, changes. When the magnetizations of the free layer 8 and pinned layer 4 are parallel, the resistance of the conventional spin valve 1 is low. When the magnetizations of the free layer 8 and the pinned layer 4 are antiparallel, the resistance of the conventional spin valve 1 is high. Similarly, when the magnetizations of the free layer 8' and pinned layer 4' are parallel, the resistance of the conventional spin tunneling junction 1' is low. When the magnetizations of the free layer 8' and pinned layer 4' are antiparallel, the resistance of the conventional spin tunneling junction 1' is high.

In order to sense the resistance of the conventional magnetic element 1/1', current is driven through the conventional magnetic element 1/1'. Current can be driven through the conventional magnetic element 1 in one of two configurations, current in plane ("CIP") and current perpendicular to the plane ("CPP"). However, for the conventional spin tunneling junction 1', current is driven in the CPP configuration. In the CIP configuration, current is driven parallel to the layers of the conventional spin valve 1. Thus, in the CIP configuration, current is driven from left to right or right to left as seen in FIG. 1A. In the CPP configuration, current is driven perpendicular to the layers of conventional magnetic element 1/1'. Thus, in the CPP configuration, current is driven up or down as seen in FIG. 1A or 1B. The CPP configuration is used in MRAM having a conventional spin tunneling junction 1' in a memory cell.

FIG. 2 depicts a conventional memory array 10 using conventional memory cells 20. Each conventional memory cell 20 includes a conventional magnetic element 1/1', depicted as a resistor in FIG. 2. The conventional memory array 10 typically uses a spin tunneling junction 1'. The conventional array 10 is shown as including four conventional memory cells 20. Each memory cell 20 includes a conventional spin tunneling junction 1' and a transistor 22. The memory cells 20 are coupled to reading/writing column selection 30 via bit lines 32 and 34 and to row selection 50 via word lines 52 and 54. Also depicted are write lines 60 and 62 which carry currents that generate external magnetic fields for the corresponding conventional memory cells 20 during writing. The reading/writing column selection 30 is coupled to write current source 42 and read current source 40 which are coupled to a voltage supply Vdd 48 via line 46.

In order to write to the conventional memory array 10, the write current Iw 42 is applied to the bit line 32 or 34 selected by the reading/writing column selection 30. The read current Ir 40 is not applied. Both word lines 52 and 54 are disabled. The transistors 22 in all memory cells are disabled. In addition, one of the write lines 60 and 62 selected carries a current used to write to the selected conventional memory cell 20. The combination of the current in the write line 60 or 62 and the current in the bit line 32 or 34 generates a magnetic field large enough to switch the direction of magnetization of the free layer 8' and thus write to the desired conventional memory cell 20. Depending upon the data written to the conventional memory cell 20, the conventional magnetic tunneling junction 1' will have a high resistance or a low resistance.

When reading from a conventional cell 20 in the conventional memory array 10, the read current Ir 40 is applied instead. The memory cell 20 selected to be read is determined by the row selection 50 and column selection 30. The output voltage is read at the output line 44.

Although the conventional magnetic memory 10 using the conventional spin tunneling junction 1' can function, one of ordinary skill in the art will readily recognize that there are barriers to the use of the conventional magnetic element 1' and the conventional magnetic memory 10 at higher memory cell densities. In particular, the conventional memory array 10 is written using an external magnetic field generated by currents driven through the bit line 32 or 34 and the write line 60 or 62. In other words, the magnetization of the free layer 8' is switched by the external magnetic field generated by current driven through the bit line 32 or 34 and the write line 60 or 62. The magnetic field required to switch the magnetization of the free layer 8', known as the switching field, is inversely proportional to the width of the conventional magnetic element 1'. As a result, the switching field increases for conventional memories having smaller magnetic elements 1'. Because the switching field is higher, the current required to be driven through the bit line 32 or 34 and particularly through the write line 60 or 62 increases dramatically for higher magnetic memory cell density. This large current can cause a host of problems in the conventional magnetic memory 10. For example, cross talk and power consumption would increase. In addition, the driving circuits required to drive the current that generates the switching field at the desired memory cell 20 would also increase in area and complexity. Furthermore, the conventional write currents have to be large enough to switch a magnetic memory cell but not so large that the neighboring cells are inadvertently switched. This upper limit on the write current amplitude can lead to reliability issues because the cells that are harder to switch than others (due to fabrication and material nonuniformity) will fail to write consistently.

Accordingly, what is needed is a system and method for providing a magnetic memory element which can be used in a memory array of high density, low power consumption, low cross talk, and high reliability, while providing sufficient read signal. The present invention addresses the need for such a magnetic memory element.

SUMMARY OF THE INVENTION

The present invention provides a method and system for providing a magnetic element capable of being written using spin-transfer effect and a magnetic memory using the magnetic element. In one aspect the method and system comprise providing a dual spin tunnel/valve structure and a spin valve structure. As used herein, the term "dual spin tunnel/valve structure", different from spin tunnel junction, refers to a structure which incorporates a spin valve and a spin tunnel junction where the spin valve and the spin tunnel structure share a common free layer. The dual spin tunnel/valve structure includes a barrier layer between a first pinned layer and a first free layer, a second pinned layer and a first nonmagnetic spacer layer between the first free layer and the second pinned layer. The spin valve includes a second nonmagnetic spacer layer between a second free layer and a third pinned layer. The magnetic element is configured to allow the free layer magnetizations of the dual spin tunnel/valve structure and the spin valve structure be magnetostatically coupled and for at least one of the free layer magnetizations to change direction due to spin transfer when a write current is passed through the magnetic element. In one embodiment, a separation layer resides between the free layer of the spin valve and the pinned layer of the spin tunnel structure. In one embodiment, the spin valve is a dual spin valve. In one such embodiment, the magnetic element includes a second spin valve. The dual spin tunnel/valve structure resides between the spin valves. In a second aspect, the method and system comprise providing two dual spin valves and a spin tunneling junction between the dual spin valves. The magnetic element is configured to allow the free layer magnetization of the free layers of one or both of the dual spin valves to change direction due to spin transfer. In one embodiment, a separation layer resides between the free layer of the spin tunneling junction and the pinned layer of one spin valve. In one embodiment, the spin tunneling junction is a dual spin tunneling junction.

According to the system and method disclosed herein, the present invention provides a magnetic element and a magnetic memory that is capable of being written using the more efficient and localized spin-transfer mechanism while requiring a reduced current for writing and providing a high readout signal. In addition, the free layers of the spin valve and spin tunneling junction can be separately tailored to improve the functions of the spin valve and spin tunneling junction, respectively.

DETAILED DESCRIPTION OF THE INVENTION

The present invention relates to an improvement in magnetic elements and magnetic memories, such as MRAM. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown, but is to be accorded the widest scope consistent with the principles and features described herein.

Figure 1A:
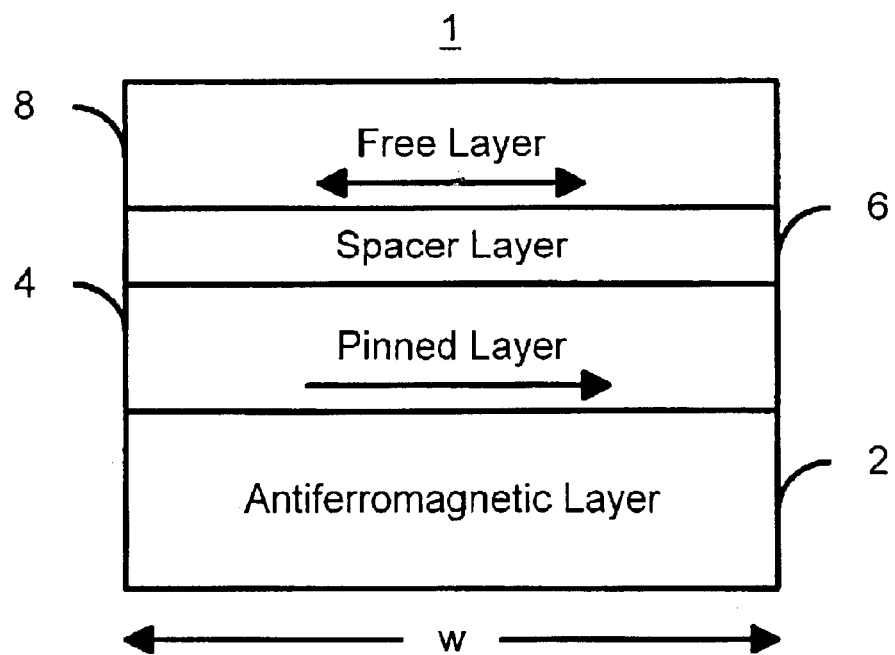
FIG. 1A is a diagram of a conventional magnetic element, a spin valve.
Figure 1B:
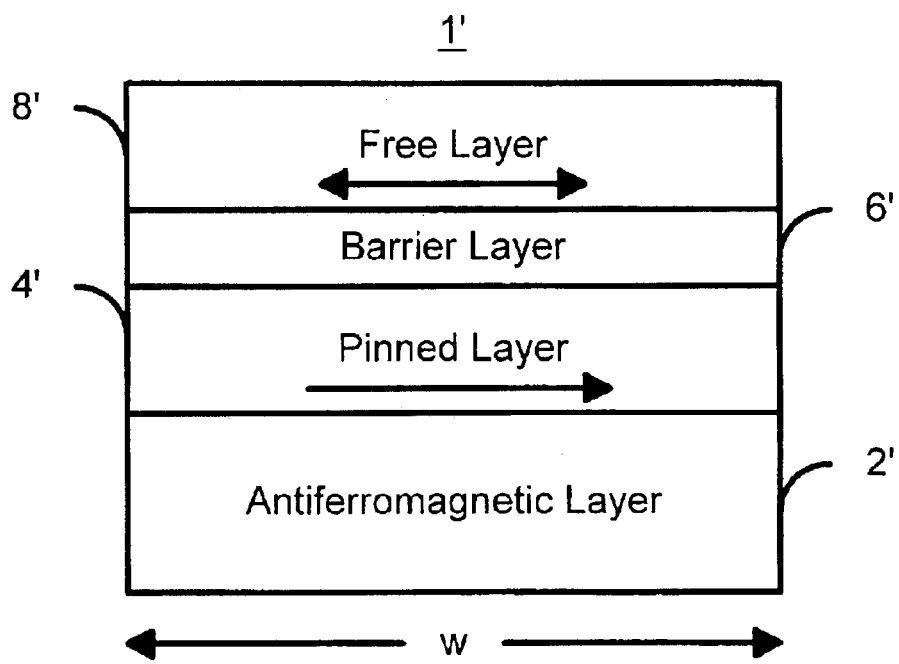
FIG. 1B is a diagram of a conventional magnetic element, a spin tunneling junction, such as an element used in a magnetic memory.
Figure 2:
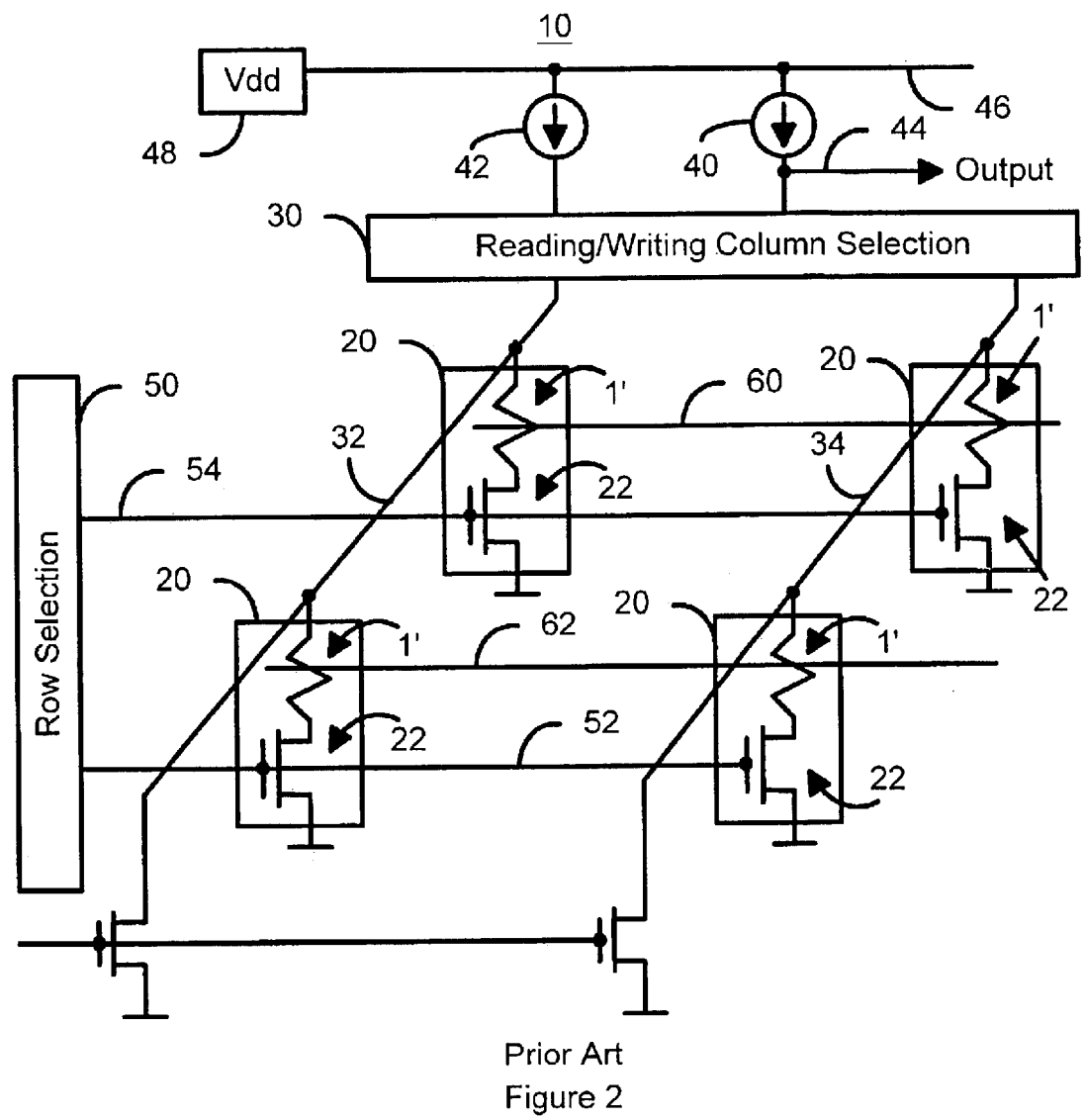
FIG. 2 is a diagram of a conventional magnetic memory array.

As described above, one of the challenges faced in increasing the density of conventional magnetic memories is the large current required to write to the conventional magnetic memories, such as the conventional magnetic memory 10 depicted in FIG. 2 and using the conventional magnetic elements 1' of FIG. 1B. In other words, the current required to generate the magnetic field that switches the direction of the magnetization of the free layer is large. This large current can be problematic because it can result in cross talk and high power consumption.

In order to overcome some of the issues associated with magnetic memories having a higher density of memory cells, a recently discovered phenomenon, spin transfer, may be utilized. Current knowledge of spin transfer is described in detail in J. C. Slonczewski, "Current-driven Excitation of Magnetic Multilayers," *Journal of Magnetism and Magnetic Materials*, vol. 159, p. L1–L5 (1996); L. Berger, "Emission of Spin Waves by a Magnetic Multilayer Traversed by a Current," *Phys. Rev. B*, Vol. 54, p. 9353 (1996), and in F. J. Albert, J. A. Katine and R. A. Buhman, "Spin-polarized Current Switching of a Co Thin Film Nanomagnet," *Appl. Phys. Lett.*, vol. 77, No. 23, p. 3809–3811 (2000). Thus, the following description of the spin transfer phenomenon is based upon current knowledge in the area and is not intended to limit the scope of the invention.

The spin-transfer effect arises from the spin-dependent electron transport properties of ferromagnetic-normal metal multilayers. When a spin-polarized current traverses a magnetic multilayer in a CPP configuration, the spin angular momentum of electrons incident on a ferromagnetic layer interacts with magnetic moments of the ferromagnetic layer near the interface between the ferromagnetic and normal-metal layers. Through this interaction, the electrons transfer a portion of their angular momentum to the ferromagnetic layer. As a result, a spin-polarized current can switch the magnetization direction of the ferromagnetic layer if the current density is sufficiently high (approximately $10^7$–$10^8$ A/cm$^2$), and if the dimensions of the multilayer are small (approximately less than two hundred nanometers) so that effects of the helical magnetic field produced by the perpendicular current are not important. In addition, for spin transfer to be able to switch the magnetization direction of a ferromagnetic layer, the ferromagnetic layer should be sufficiently thin, for instance, preferably less than approximately ten nanometers for Co.

The phenomenon of spin transfer can be used in the CPP configuration as an alternative to or in addition to using an external switching field to switch the direction of magnetization of the free layer 8 or 8' of the conventional spin valve 1 or the conventional spin tunneling junction 1', respectively. Spin transfer is a phenomenon which dominates other mechanisms and becomes observable when the dimensions of the conventional magnetic element 1/1' are small, in the range of few hundred nanometers. Consequently, spin transfer is suitable for higher density magnetic memories having smaller magnetic elements 1/1'.

For example, switching the magnetization of the conventional free layer 8 in the conventional spin valve 1 using spin transfer is described. Current can be driven from the conventional free layer 8 to the conventional pinned layer 4 to switch the magnetization of the conventional free layer 8 to be parallel to the magnetization of the conventional pinned layer 4. The magnetization of the conventional free layer 8 is assumed to be initially antiparallel to the conventional pinned layer 4. When current is driven from the conventional free layer 8 to the conventional pinned layer 4, conduction electrons travel from the conventional pinned layer 4 to the conventional free layer 8. The majority electrons traveling from the conventional pinned layer 4 have their spins polarized in the same direction as the magnetization of the conventional pinned layer 4. These electrons interact with the magnetic moments of the conventional free layer 8 near the interface between the conventional free layer 8 and the conventional spacer layer 6. As a result of this interaction, the electrons transfer their spin angular momentum to the conventional free layer 8. Thus, angular momentum corresponding to spins antiparallel to the magnetization of the conventional free layer 8 (and parallel to the conventional pinned layer 4) is transferred to the conventional free layer. If sufficient angular momentum is transferred by the electrons, the magnetization of the conventional free layer 8 can be switched to be parallel to the magnetization of the conventional pinned layer 4.

Alternatively, current can be driven from the conventional pinned layer 4 to the conventional free layer 8 to switch the magnetization of the conventional free layer 8 to be antiparallel to the magnetization of the conventional pinned layer 8. In this case the magnetization of the free layer 8 is assumed to be initially parallel to the pinned layer 4. When current is driven from the conventional pinned layer 4 to the conventional free layer 8, conduction electrons travel in the opposite direction. The majority electrons have their spins polarized in the direction of magnetization of the conventional free layer 8, which is originally magnetized in the same direction as the conventional pinned layer 4. These majority electrons are transmitted through the conventional pinned layer 4. However, the minority electrons, which have spins polarized antiparallel to the magnetization of the conventional free layer 8 and the conventional pinned layer 4, will be reflected from the conventional pinned layer 4 and travel back to the conventional free layer 8. The minority electrons reflected by the conventional pinned layer 4 interact with magnetic moments of the conventional free layer 8 and transfer at least a portion of their spin angular momentum to the conventional free layer 8. If sufficient angular momentum is transferred by the electrons to the conventional free layer 8, the magnetization of the free layer 8 can be switched to be antiparallel to the magnetization of the conventional pinned layer 4.

Using a current driven through the conventional magnetic elements 1 or 1' in the CPP configuration, spin transfer can switch the direction of magnetization of the free layer 8 or 8', respectively. Thus, spin transfer can be used to write to magnetic elements 1 or 1' in a magnetic memory by using a current through the conventional magnetic element 1 or 1'. The mechanism of spin-transfer writing is, therefore, more localized and generates less cross talk. Spin transfer is also more reliable because spin transfer results in a high effective field in the conventional magnetic elements 1/1' in a device such as MRAM. In addition, for a magnetic element 1 or 1' having a small enough size, the current required to switch the magnetization can be significantly less than the current required to generate a switching field in the conventional magnetic memory 10. Thus, there is less power consumption in writing.

Although the phenomenon of spin transfer can be used to switch the direction of the magnetization of the conventional free layer 8/8', one of ordinary skill in the art will readily recognize that there are additional barriers to using the conventional magnetic element 1/1' in a memory. For the conventional spin valve 1, the CPP configuration results in a significantly reduced signal. For example, the magnetoresistance ratio for the CPP configuration of the conventional spin valve 1 is only approximately two percent. In addition, the total resistance of the conventional spin valve 1 is low. Thus, the read signal output by the conventional spin valve 1 is very low. Although spin transfer can be used to write to a conventional spin valve 1, the output signal when reading from the conventional spin valve 1 is low enough to make it difficult to use the conventional spin valve 1 in a magnetic memory that is written using spin transfer.

On the other hand, a conventional spin tunneling junction 1' typically has a large resistance-area product, with Ra~k$\Omega\mu m^2$. A high current density used to induce the spin-transfer effect could destroy thin insulating barrier due to ohmic dissipation. Moreover, the spin transfer has not been observed in the conventional spin tunneling junction 1' at room temperature. The conventional spin tunneling junction 1' having high Ra values may, therefore, not be able to be used in MRAM using spin transfer to write to the magnetic memory cells. Consequently, one of ordinary skill in the art would recognize that a reliable, localized mechanism for writing to magnetic memories having higher densities and smaller magnetic elements is still desired.

The present invention provides a method and system for providing a magnetic element capable of being written using spin-transfer effect and a magnetic memory using the magnetic element. In one aspect the method and system comprise providing a dual spin tunnel/valve structure and a spin valve structure. As used herein, the term "dual spin tunnel/valve structure", different from spin tunnel junction, refers to a structure which incorporates a spin valve and a spin tunnel junction where the spin valve and the spin tunnel structure share a common free layer. The dual spin tunnel/valve structure includes a first barrier layer between a first pinned layer and a first free layer. The dual spin tunnel/valve structure also includes a first nonmagnetic spacer layer between a second pinned layer and the first free layer. The first free layer thus resides between the first barrier layer and the first nonmagnetic spacer layer. The spin valve includes a second nonmagnetic spacer layer between a second free layer and a third pinned layer. The magnetic element is configured to allow the free layer magnetizations of the dual spin tunnel/valve structure and the spin valve structure be magnetostatically coupled and for at least one of the free layer magnetizations to change direction due to spin transfer when a write current is passed through the magnetic element. In one embodiment, a separation layer resides between the free layer of the spin valve and the pinned layer of the spin tunnel structure. The separation layer is configured to allow the second free layer and the first free layer to be magnetostatically coupled, while allowing the second free layer to remain free of direct ferromagnetic coupling and pinning due to the presences of antiferromagnetic layers. In one embodiment, the spin valve is a dual spin valve. In one such embodiment, the magnetic element includes a second spin valve.

The dual spin tunnel/valve structure resides between the spin valves. In a second aspect, the method and system comprise providing a two dual spin valves and a spin tunneling junction between the dual spin valves. The magnetic element is configured to allow the magnetization of the free layers of one or both of the dual spin valves to change direction due to spin transfer. In one embodiment, a separation layer resides between the free layer of the spin tunneling junction and the pinned layer of one spin valve. The separation layer is configured to allow the first free layer and the second free layer to be magnetostatically coupled, while allowing the second free layer to remain free of direct ferromagnetic coupling and pinning due to the presences of antiferromagnetic layers. In one embodiment, the spin tunneling junction is a dual spin tunneling junction.

The present invention will be described in terms of a particular magnetic memory and a particular magnetic element having certain components. However, one of ordinary skill in the art will readily recognize that this method and system will operate effectively for other magnetic memory elements having different and/or additional components and other magnetic memories having different and/or other features not inconsistent with the present invention. The present invention is also described in the context of current understanding of the spin transfer phenomenon. Consequently, one of ordinary skill in the art will readily recognize that theoretical explanations of the behavior of the method and system are made based upon this current understanding of spin transfer. One of ordinary skill in the art will also readily recognize that the method and system are described in the context of a structure having a particular relationship to the substrate. However, one of ordinary skill in the art will readily recognize that the method and system are consistent with other structures. For example, the present invention is described in terms of certain top spin valves (having a pinned layer at the top of the spin valve) and bottom spin tunneling junctions (having a pinned layer at the bottom of the spin tunneling junction). The present invention is also consistent with a top tunneling junction and a bottom spin valve. In addition, the method and system are described in the context of certain layers being synthetic. However, one of ordinary skill in the art will readily recognize that other and/or additional layers, for example free layers, could be synthetic. Furthermore, the present invention is described in the context of certain features, provided by different structures. However, one of ordinary skill in the art will readily recognize that the present invention is consistent with any combination of one or more of the above features. The present invention is also primarily disclosed in the context of a single spin valve and a single spin tunneling junction. However, one of ordinary skill in the art will readily recognize that the present invention is consistent with dual spin valves and/or dual spin tunneling junctions.

Figure 3:
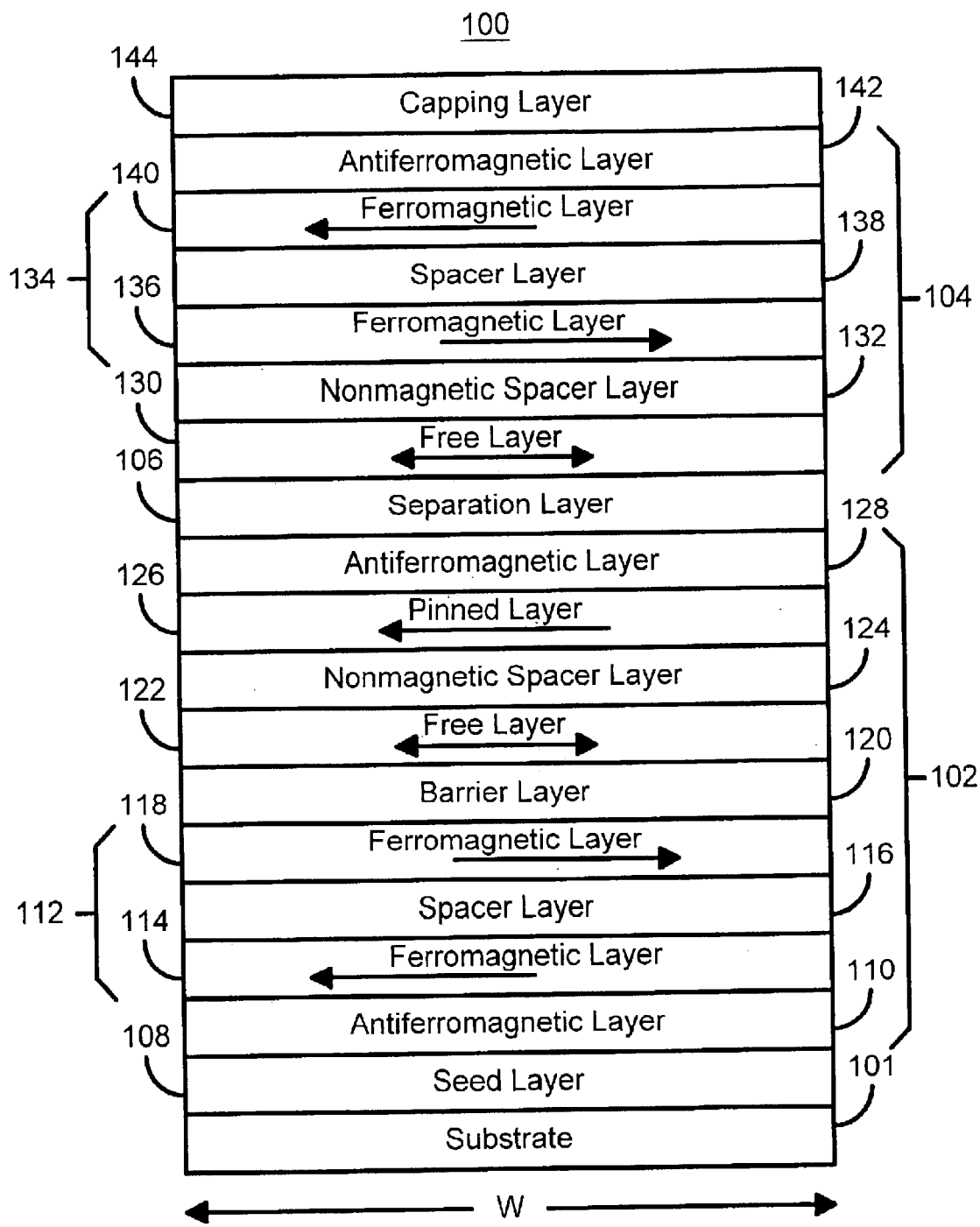
FIG. 3 is a diagram depicting one embodiment of a magnetic element in accordance with the present invention.

To more particularly illustrate the method and system in accordance with the present invention, refer now to FIG. 3, which depicts one embodiment of a magnetic element 100 in accordance with the present invention. Note that other layers may not be depicted for clarity. The magnetic element 100 includes a dual spin tunnel/valve structure 102 and a spin valve 104, preferably separated by a separation layer 106. The dual spin tunnel/valve structure 102 is formed on a seed layer 108, which can reside on a substrate 101. The seed layer 108 is preferably Ta/NiFeCr, TaN/NiFeCr, or other material that contributes to a crystalline film stack having a desired texture orientation and a large grain size. The dual spin tunnel/valve structure 102 includes an antiferromagnetic (AFM) layer 110, a pinned layer 112, a barrier layer 120, a free layer 122, a nonmagnetic spacer layer 124, a pinned layer 126, and another AFM layer 128. The AFM layers 110 and 128 preferably include PtMn, but may also include PdPtMn, NiMn, IrMn or other AFM materials. The pinned layer 112, the free layer 122, and the pinned layer 126 are ferromagnetic. The free layer 122 may include Co, Fe, Ni or their alloys, such as CoFe, CoNi, CoFeNi and NiFe. Alternatively, the free layer 122 may be synthetic. In addition, a small concentration of Cr, Cu, Pt, Ti and/or other nonmagnetic materials can be doped into the ferromagnetic materials for improving the thermal stability of the magnetic element 100 as well as for optimizing properties such as magnetostriction ($\lambda$), saturation magnetization ($M_s$), bulk spin asymmetry coefficient ($\beta$) and magnetic damping constants ($\alpha$). The pinned layer 112 is preferably a synthetic pinned layer including ferromagnetic layers 114 and 118 separated by a spacer layer 116. The spacer layer 116 is conductive and has an adequate thickness that the ferromagnetic layers 114 and 118 are antiferromagnetically coupled. The ferromagnetic layers 114 and 118 preferably include Co or CoFe, while the spacer layer 116 preferably includes Ru, but may also include Ir, Rh and Re, or other materials. Although the pinned layer 112 is depicted as being synthetic, the pinned layer 112 may also be a simple, single constituent ferromagnetic layer made of materials similar to those used in the free layer 120 or the pinned layer 126. The pinned layer 112, the free layer 120, and the pinned layer 126 may also include half-metallic materials, such as $CrO_2$, $Sr_2FeMoO_6$, $(La_{0.7}Sr_{0.3})MnO_3$, and NiMnSb or laminated ferromagnetic and half-metallic layers. The pinned layers 112 and 126 and the free layer 120 may also include ferrimagnets, including but not limited to alloys of CoGd. Thus, as used herein, the term "ferromagnetic" includes, but is not limited to ferromagnets and ferrimagnets. The pinned layer 126 is preferably a single constituent ferromagnetic layer, for example including Co or CoFe. The barrier layer 120 is an insulator, such as $Al_2O_3$, $ZrO_2$ and $HfO_2$, and is sufficiently thin to allow tunneling of charge carriers through the barrier layer 120. The nonmagnetic spacer layer 124 is preferably conductive and includes but is not limited to materials such as Cu. The dual spin tunnel/valve structure 102 can be considered to be a combination of a spin tunneling junction portion and a spin valve portion, which share a free layer. The spin tunneling junction portion includes the AFM layer 110, the pinned layer 112, the barrier layer 120 and the free layer 122. The spin valve portion includes the free layer 122, the nonmagnetic spacer layer 124, the pinned layer 126 and the AFM layer 128.

The spin valve 104 includes a free layer 130, a nonmagnetic spacer layer 132, a pinned layer 134 and an AFM layer 142. The AFM layer 136 preferably includes PtMn, but may also include PdPtMn, NiMn, IrMn or other AFM materials. The pinned layer 134 and free layer 130 are ferromagnetic. The free layer 130 may include Co, Fe, Ni or their alloys, such as CoFe, CoNi, CoFeNi and NiFe. Alternatively, the free layer 130 may be synthetic. In addition, a small concentration of Cr, Cu, Pt, Ti and/or other nonmagnetic materials can be doped into the ferromagnetic materials for improving the thermal stability of the magnetic element 100 as well as for optimizing properties such as magnetostriction ($\lambda$), saturation magnetization ($M_s$), bulk spin asymmetry coefficient ($\beta$) and magnetic damping constants ($\alpha$). The pinned layer 134 is preferably a synthetic pinned layer including ferromagnetic layers 136 and 140 separated by a spacer layer 138. The nonmagnetic spacer layer 132 is preferably conductive and includes, but is not limited to, materials such as Cu. The spacer layer 138 is conductive and has an adequate thickness that the ferromagnetic layers 136 and 140 are antiferromagnetically coupled. The ferromagnetic layers 136 and 140 preferably include Co and CoFe, while the spacer layer 138 preferably includes Ru, but may also include Ir, Rh and Re. Although the pinned layer 134 is depicted as being synthetic, the pinned layer 134 may also be a simple, single constituent ferromagnetic layer made of materials similar to those used in the free layer 130. The pinned layer 134 and free layer 130 may also include half-metallic materials, such as $CrO_2$, $Sr_2FeMoO_6$, $(La_{0.7}Sr_{0.3})MnO_3$, and NiMnSb or laminated ferromagnetic and half-metallic layers.

In the preferred embodiment the dual spin tunnel/valve structure 102 of the magnetic element 100 is used to read the magnetic state of element 100, as described below. Also in the preferred embodiment, the spin transfer effect, in combination with a magnetostatic coupling between free layers 130 and 122, is used to write the magnetic element 100. In particular, the free layer 130 of the spin valve 104 is written to using spin transfer. Because the free layer 130 is magnetostatically coupled to the free layer 122, a change in the direction of magnetization of the free layer 130 induces a change in direction of the magnetization of the free layer 122. The spin valve portion of the spin tunnel structure 102 provides an added spin transfer torque to the free layer 122 of the spin tunnel structure. This added torque lowers the field required to induce magnetization reversal of free layer 122 of the spin tunnel structure 102. Thus, the free layer 130 in the spin valve 104, which provides this switching field for the free layer 122, can be optimized so that its dipolar field is lower. Since spin transfer switching current as well as dipolar field scale with magnetic moment, a lower dipolar field invariably leads to a lower spin transfer switching current.

The magnetic element 100 is configured to allow the magnetizations of the free layer 130 to be switched using spin transfer. Consequently, the dimensions of the magnetic element 100 are small, in the range of few hundred nanometers. In a preferred embodiment, the width (parallel to the plane of the page in FIG. 3) of the magnetic element 100 is less than two hundred nanometers and preferably approximately one hundred nanometers. The magnetic element 100 preferably has a depth, perpendicular to the plane of the page in FIG. 3, of approximately fifty nanometers. The depth is preferably smaller than the width of the magnetic element 100 so that the magnetic element 100 has some shape anisotropy, ensuring that one or both of the free layers 122 and 130 has a preferred direction. In addition, the thickness of the free layer(s) 122 and 130 is small enough that the spin transfer is strong enough to rotate the free layer magnetization into and out of alignment with the magnetization of the pinned layers 112, 128, and 126. In a preferred embodiment, the free layers 122 and 130 have a thickness of less than five nm.

The separation layer 106 is preferably a nonmagnetic conductive layer. Thus, the separation layer 106 can include materials such as Cu, Au or Ag. Here the separation layer is thick enough that the free layer 130 does not become pinned by the antiferromagnetic layer 128 but thin enough to allow magnetostatic coupling of the free layers 122 and 130. This thickness is preferably at least five to fifty Angstroms. Furthermore, the total thickness of the layers between free layer 130 and free layer 122, including the separation layer 106, is sufficient to allow for magnetostatic coupling between the free layer 122 and the free layer 130. In a preferred embodiment, the free layer 122 and the free layer 130 are magnetostatically coupled to be antiparallel, as shown in FIG. 3. For example, when the magnetic element 100 is an ellipsoid of $0.1 \times 0.2$ $\mu m^2$ the free layer 122 is magnetostatically coupled due to edge magnetic poles and is, therefore, antiparallel to the free layer 134. However, in an alternate embodiment, the directions of the magnetizations of the free layers 122 and 124 could be coupled in another direction with respect to each other.

Also in a preferred embodiment, the geometry of the layers of the magnetic element is tailored to reduce the magnetic interactions from ferromagnetic layers 112, 122, 126, 130 and 134 other than the free layers 122 and 130 on the free layers 122 and 130. The thicknesses of the ferromagnetic layers 112, 122, 126, 130 and 134, the nonmagnetic spacer layers 124 and 132, and the barrier layer 120 are elected to balance the interaction and demagnetization fields of the ferromagnetic layers 112, 122, 126, 130 and 134 so that the free layers 122 and 130 do not experience a strong net bias from the ferromagnetic layers 112, 122, 126, 130 and 134. In other words, the total of the magnetostatic field and the interlayer and static coupling fields from layers other than the free layers 122 and 130 preferably sum to zero to reduce the bias on the free layers 122 and 130. In addition, the geometry of the free layers 122 and 130 is tailored to ensure that the first free layer 122 switches to remain antiparallel to the second free layer 130 when the free layer 130 is switched using spin transfer.

In operation, the magnetic element 100 is written by driving current in a CPP configuration and exploiting spin transfer. Currently, the spin transfer phenomenon is predominantly provided using the spin valve 104 and spin valve portion of the dual spin tunnel/valve structure 102. In particular, a current can be driven from the dual spin tunnel/valve structure 102 through the spin valve 104. Electrons, therefore, travel down from the spin valve 104 through the dual spin tunnel/valve structure 102. This current corresponds to electrons spin polarized in the direction of magnetization of the ferromagnetic layer 136 and the pinned layer 126. The electrons from the ferromagnetic layer 136 can transfer a portion of their angular momentum to the free layer 130. The electrons can thus set the magnetization of the free layer 130 in the same direction as the magnetization of the ferromagnetic layer 136. Similarly, electrons from the pinned layer 126 can transfer a portion of their angular momentum to the free layer 122. The electrons can thus exert a torque on the magnetization of the free layer 122 in the same direction as the magnetization of the pinned layer 126. As a result, the switching field from antiparallel to the pinned layer 126 to parallel to pinned layer 126 is reduced. As can be seen in FIG. 3, the ferromagnetic layer 136 is oriented opposite to the pinned layer 126. Thus, when the magnetization of the free layer 130 is switched with a spin transfer current, the dipolar coupling field produced by free layer 130, along with the torque from pinned layer 126, acts to switch the free layer 122 into the state parallel state to pinned layer 122 and antiparallel to free layer 130. The magnetization of the free layers 122 and 130 remain antiparallel after switching. Furthermore, when the spin transfer current is reduced to zero, the antiparallel coupling field between free layers 122 and 130 remains, allowing the layers 122 and 130 to remain antiparallel. Thus, when current is driven in a direction from the dual spin tunnel/valve structure 102 to the spin valve 104, the direction of magnetization of the free layer 130 is switched to be parallel to the magnetization of the ferromagnetic layer 136 of the pinned layer 134, respectively.

For the case in which the current is driven in the opposite direction, the magnetization of the free layer 130 is assumed to be initially parallel to the magnetization of the ferromagnetic layer 136. Current is driven from the spin valve 104 to the dual spin tunnel/valve structure 102, with electrons traveling in the opposite direction. Majority electrons leaving the free layer 130 have their spins polarized parallel to the magnetization of the free layer 130. These electrons have their spins polarized parallel to the ferromagnetic layer 136 and are thus transmitted by the ferromagnetic layer 136. The minority electrons have their spins polarized antiparallel to the magnetizations of the free layer 130 and the ferromagnetic layer 136. Minority electrons are thus reflected by the ferromagnetic layer 136. Minority electrons reflecting off of the ferromagnetic layer 136 of the pinned layer 134 and returning to the free layer 130 can transfer a portion of their angular momentum to the free layer 130. Thus, the minority electrons reflecting from the ferromagnetic layer 136 can switch the magnetization of the free layer 130 to be antiparallel to the magnetization of the ferromagnetic layer 136. Similarly, majority electrons are transmitted by the pinned layer 126, while minority electrons are reflected. The minority electrons can transfer a portion of their angular momentum to the free layer 122 and thus exert a torque on the free layer 122. The switching field of free layer 122 is, therefore, is reduced, allowing the magnetization of the free layer 122 to be more easily switched by the dipolar field produced by free layer 130. Thus, the magnetizations of the free layers 122 and 130 remain antiparallel.

During reading, the properties of the spin tunneling junction portion of the dual spin tunnel/valve structure 102 and the magnetostatic coupling between the free layers 122 and 130 are exploited. Because of the insulating barrier 120, the resistance of the dual spin tunnel/valve structure 102 is large. Thus, the dual spin tunnel/valve structure 102 dominates the output signal. Moreover, because of the magnetostatic coupling between the free layers 122 and 130, the magnetization of the first free layer 122 of the dual spin tunnel/valve structure 102 is related to the direction of magnetization of the second free layer 130 of the spin valve 104. A large signal can, therefore, be obtained using the spin tunneling junction portion of the dual spin tunnel/valve structure 102 even though spin transfer has not been observed in spin tunneling junction at room temperature.

Depending upon the direction of the magnetization of the free layer 122, the resistance of the dual spin tunnel/valve structure 102 will be either low (free layer 122 magnetization parallel to pinned layer 112 magnetization) or high (free layer 122 magnetization antiparallel to pinned layer 112 magnetization). As stated above, because of its high resistance, the dual spin tunnel/valve structure 102 dominates the signal of the magnetic element 100. By driving a read current in a CPP configuration, the resistance state of the dual spin tunnel/valve structure 102 can be determined. Note, however, that the read current is substantially less than the current used to write to the magnetic element 100 in order to prevent inadvertent writing of the magnetic element 100. In a preferred embodiment, the read current is an order of magnitude less than the write current.

Consequently, spin transfer can be used to write to magnetic element 100. As a result, a switching field driven by an external current is unnecessary. Instead, a more localized and reliable phenomenon, spin transfer, is used to write to both the dual spin tunnel/valve structure 102 and the spin valve 104 of the magnetic element 100. Furthermore, because of the magnetostatic coupling between the free layers 122 and 130, the directions of magnetization of the free layers 122 and 130 are related. As a result, the dual spin tunnel/valve structure 102 can be used to read the data that has been written to the spin valve 104 as well as the data written to the dual spin tunnel/valve structure. Consequently, a higher output signal is achieved.

Figure 4:
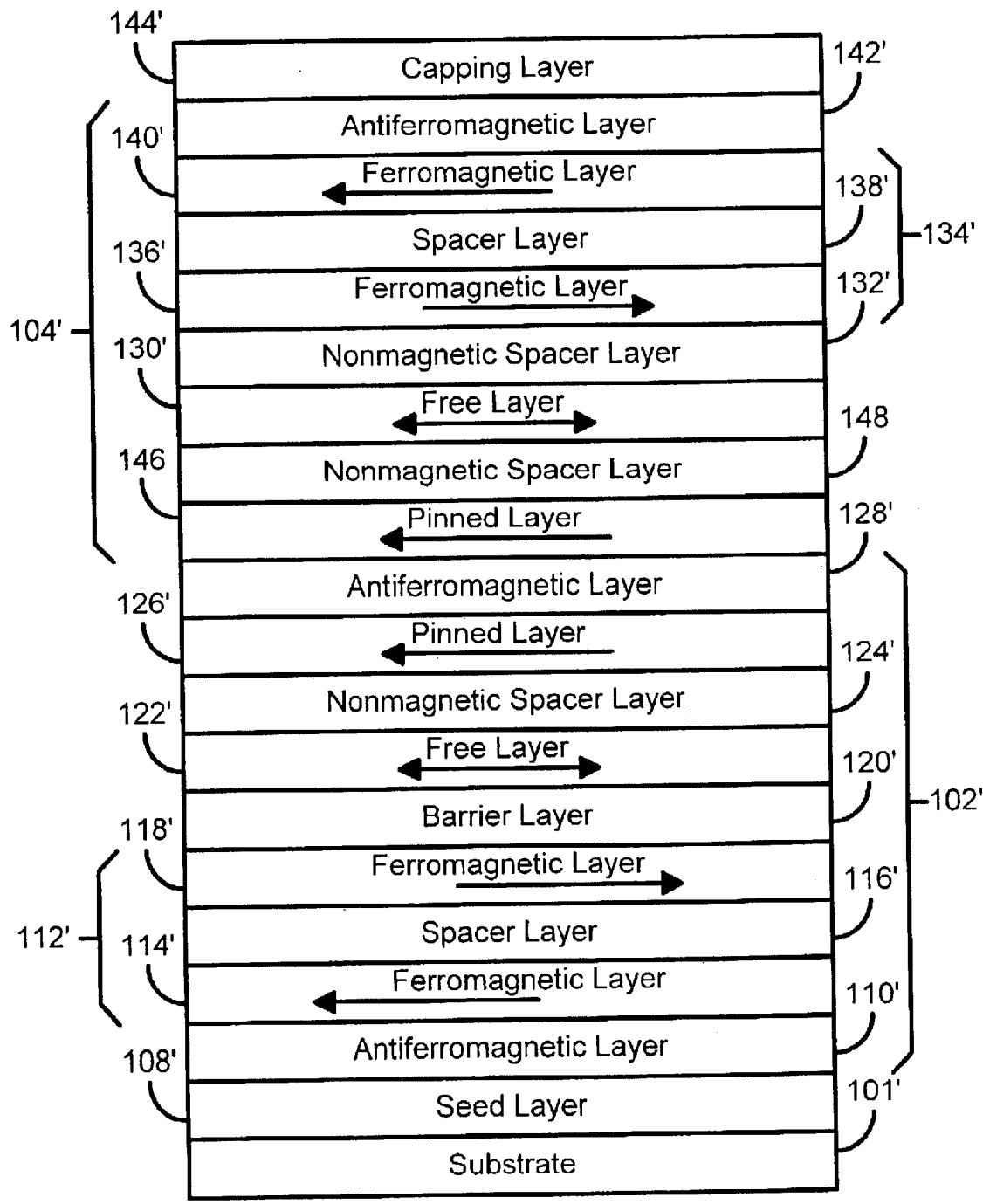
FIG. 4 is a diagram depicting a second embodiment of a magnetic element in accordance with the present invention.

FIG. 4 is a diagram depicting a second embodiment of a magnetic element 100' in accordance with the present invention. The magnetic element 100' has many of the same components as the magnetic element 100 depicted in FIG. 3. Consequently, analogous structures are labeled similarly for the magnetic element 100' depicted in FIG. 4. In addition, these components are preferably fabricated in an analogous manner and made from similar materials as analogous components in the magnetic element 100. However, the spin valve is a dual spin valve 104'. In addition to the free layer 130', the nonmagnetic spacer layer 132', the pinned layer 134', and the AFM layer 140', the dual spin valve 104' also includes a pinned layer 146 and a nonmagnetic spacer layer 148. In this embodiment the pinned layer 134' is preferably a synthetic pinned layer including ferromagnetic layers 140' and 136' separated by a spacer layer 138'. Also In this embodiment the pinned layer 112' is preferably a synthetic pinned layer including ferromagnetic layers 118' and 114' separated by a spacer layer 116'. In addition, the AFM layer 128 is preferably shared by the dual spin tunnel/valve structure 102' and the dual spin valve 104'. The materials used in the magnetic element 100' are preferably the same as those used for analogous components of the magnetic element 100 depicted in FIG. 3. Referring back to FIG. 4, in a preferred embodiment, the separation layer 106 is also omitted. However, in an alternate embodiment, the separation layer could be used and separate AFM layers provided. In addition, although depicted as a simple ferromagnetic layer, the pinned layer 146 may be synthetic.

The magnetic element 100' functions in essentially the same manner as the magnetic element 100. However, because of the use of a dual spin valve 104', the spin transfer phenomenon used to write to the free layer 130 employs electrons from both the ferromagnetic layer 136' and the pinned layer 146. For either current direction, transmitted majority electrons from one pinned layer 134' or 146 as well as the reflected minority electrons from the other pinned layer 146 or 134', respectively, exert a spin transfer torque on free layer 130. In the context of the magnetic element 100', for electrons traveling from the spin valve 104' toward the dual spin tunnel/valve structure 102', the transmitted majority electrons from the ferromagnetic layer 136' as well as the reflected minority electrons from the pinned layer 146 exert a spin transfer torque on free layer 130. For the current flowing in the opposite direction, where electrons flow from the dual spin tunnel/valve structure 102' toward the spin valve 104', the transmitted majority electrons from the pinned layer 146 as well as the reflected minority electrons from the ferromagnetic layer 136' exert a spin transfer torque on free layer 130. Thus, a lower current can thus be used to write to the free layer 130. Consequently, in addition to the benefits achieved by the magnetic element 100, the write current can be reduced while maintaining a high read signal from the dual spin tunnel/valve structure 102'.

Figure 5:
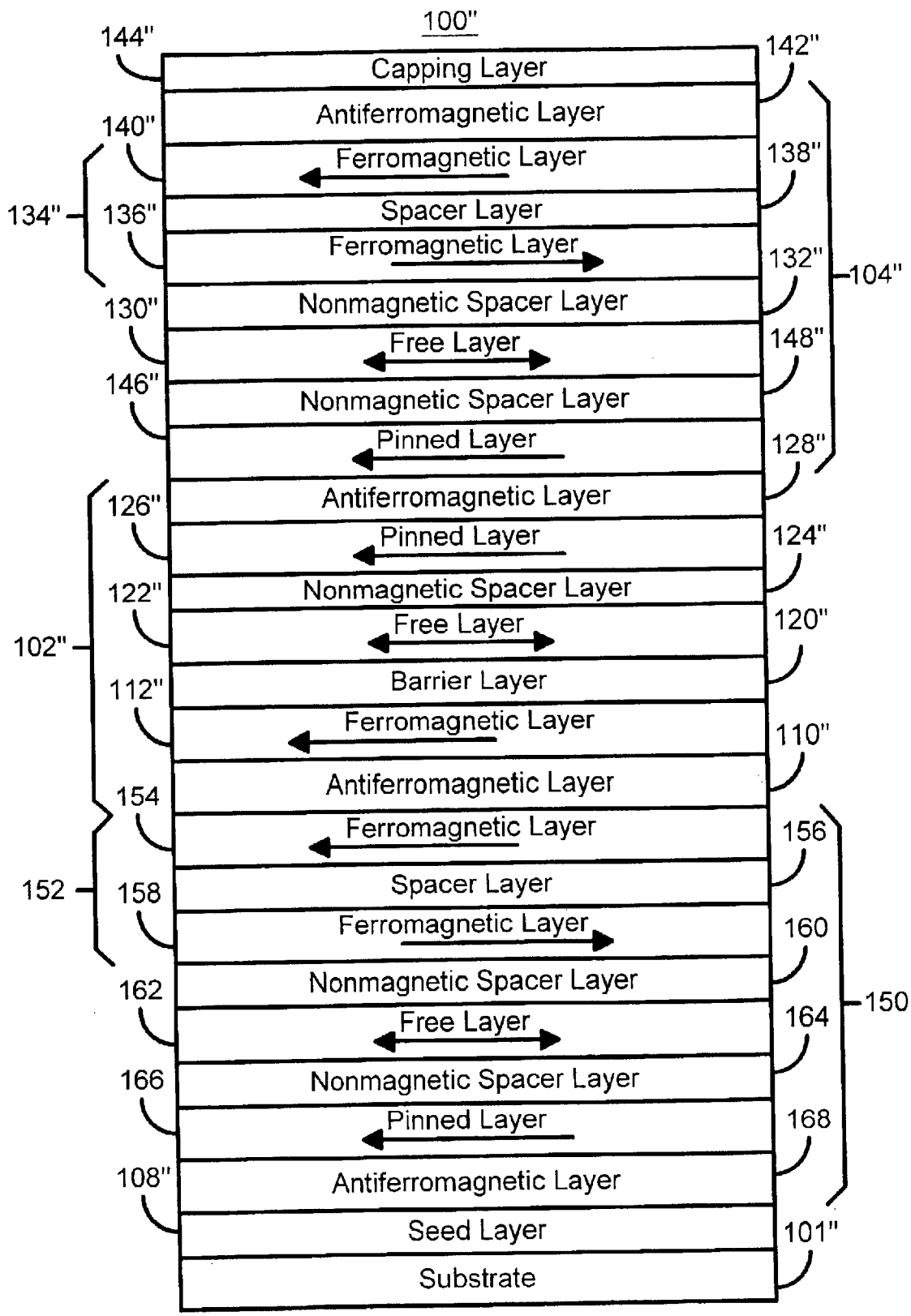
FIG. 5 is a diagram depicting a third embodiment of a magnetic element in accordance with the present invention.

FIG. 5 is a diagram depicting a third embodiment of a magnetic element 100" in accordance with the present invention. The magnetic element 100" has many of the same components as the magnetic element 100' depicted in FIG. 4. Consequently, analogous structures are labeled similarly for the magnetic element 100" depicted in FIG. 5. In addition, FIG. 5 also includes an additional dual spin valve 150. The second dual spin valve 150 includes a ferromagnetic pinned layer 152, a nonmagnetic spacer layer 160, a ferromagnetic free layer 162, another nonmagnetic spacer layer 164, a pinned layer 166 and an AFM layer 168. The nonmagnetic spacer layer 160 is preferably conductive and includes, but is not limited to, materials such as Cu. The pinned layer 152 is preferably a synthetic pinned layer including ferromagnetic layers 154 and 158 separated by a spacer layer 156. The materials used in the magnetic element 100" are preferably the same as those used for analogous components of the magnetic element 100' depicted in FIG. 4. However, note that the dual spin tunnel/valve structure 102" shares antiferromagnetic layers 110" and 128' with the dual spin valves 150 and 104", respectively.

The magnetic element 100" functions in essentially the same manner as the magnetic element 100'. However, the magnetic element 100" employs two dual spin valves 104" and 150, each of which has a free layer 130" and 162, respectively, that is magnetostatically coupled to the free layer 122" of the dual spin tunnel/valve structure 102". Thus the dipolar field required by either dual spin valve 104" or 150 in order to switch the free layer 122" is roughly cut in half. Because the dipolar coupling field and the spin transfer switching current scale with magnetic moment, the free layers 130" and 162 can be further optimized to reduce spin transfer switching current. Consequently, in addition to the benefits achieved by the magnetic element 100, the write current can be reduced while maintaining a high read signal from the dual spin tunnel/valve structure 102".

Figure 6:
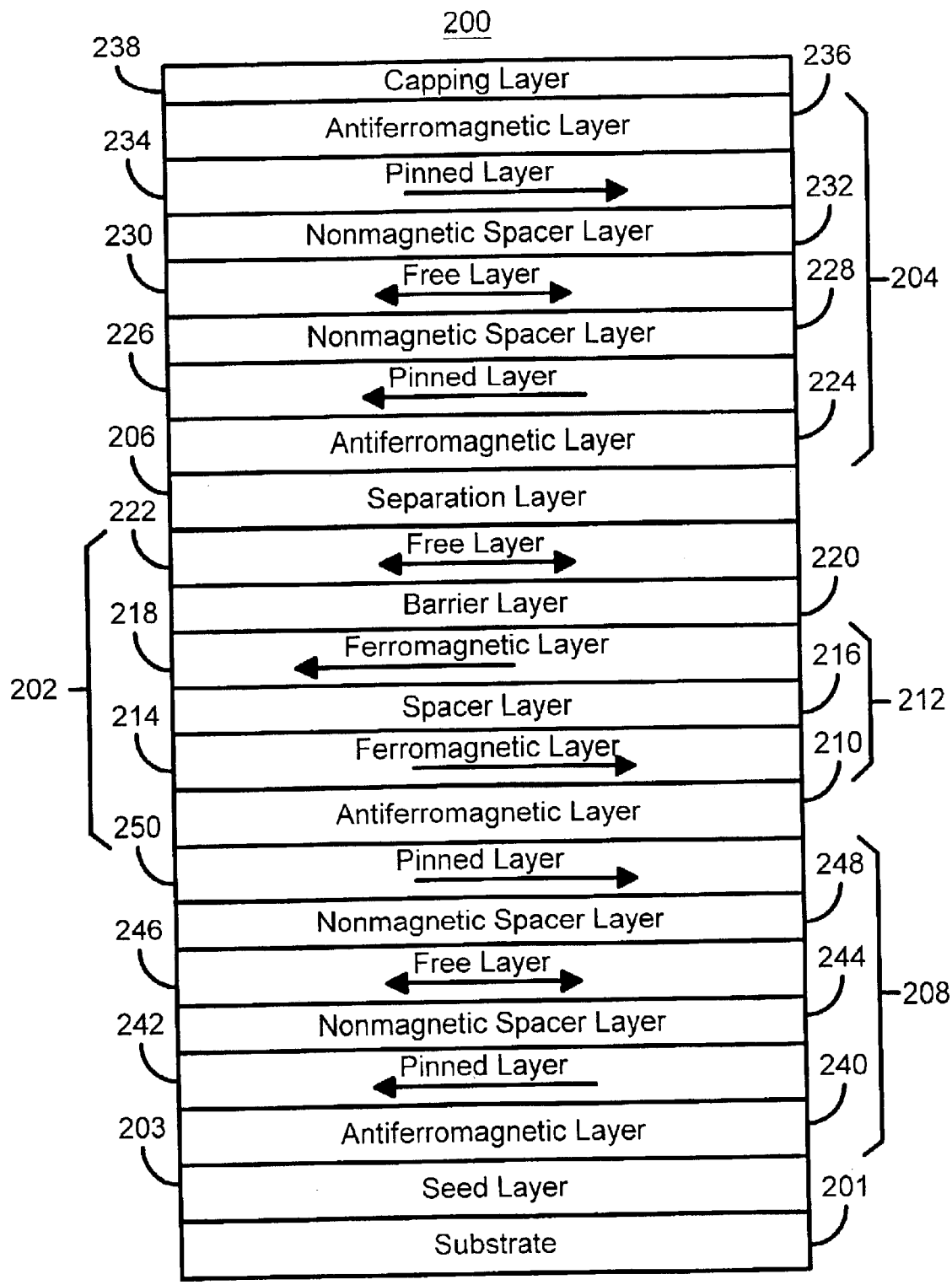
FIG. 6 is a diagram depicting a fourth embodiment of a magnetic element in accordance with the present invention.

FIG. 6 depicts one embodiment of a magnetic element 200 in accordance with the present invention. Note that certain layers may not be depicted for clarity. The magnetic element 200 includes a spin tunneling junction 202, a spin valve 204, preferably separated by a separation layer 206, as well as a second dual spin valve 208. The second dual spin valve 208 is formed on a seed layer 203, which can reside on a substrate 201. The seed layer 203 is preferably Ta/NiFeCr, TaN/NiFeCr, or other material that contributes to a crystalline film stack having a desired texture orientation and a large grain size. The spin tunneling junction 202 includes an AFM layer 210, a pinned layer 212, a barrier layer 220, and a free layer 222. The AFM layer 210 preferably includes PtMn, but may also include PdPtMn, NiMn, IrMn or other AFM materials. The AFM layer 210 is preferably shared with the dual spin valve 208. The pinned layers 212 and 226 and the free layer 222 are ferromagnetic. The free layer 222 may include Co, Fe, Ni or their alloys, such as CoFe, CoNi, CoFeNi and NiFe. Alternatively, the free layer 222 may be synthetic. In addition, a small concentration of Cr, Cu, Pt, Ti and/or other nonmagnetic materials can be doped into the ferromagnetic materials for improving the thermal stability of the magnetic element 200 as well as for optimizing properties such as magnetostriction, saturation magnetization, bulk spin asymmetry coefficient, and magnetic damping constants. The pinned layer 212 is preferably a synthetic pinned layer including ferromagnetic layers 214 and 218 separated by a spacer layer 216. The spacer layer 216 is conductive and has adequate thickness that the ferromagnetic layers 214 and 218 are antiferromagnetically coupled. The ferromagnetic layers 214 and 218 preferably include Co or CoFe, while the spacer layer 216 preferably includes Ru, but may also include materials such as Ir, Rh, and Re. Although the pinned layer 212 is depicted as being synthetic, the pinned layer 212 may also be a simple, single constituent ferromagnetic layer made of materials similar to those used in the free layer 222 or the pinned layer 212. The pinned layer 212 and the free layer 222 may also include half-metallic materials, such as $CrO_2$, $Sr_2FeMoO_6$, $(La_{0.7}Sr_{0.3})MnO_3$, and NiMnSb or laminated ferromagnetic and half-metallic layers. The barrier layer 220 is an insulator, such as $Al_2O_3$, $ZrO_2$ and $HfO_2$, and is sufficiently thin to allow tunneling of charge carriers through the barrier layer 220.

The dual spin valve 204 includes an AFM layer 224, a pinned layer 226, a nonmagnetic spacer layer 228, a free layer 230, a nonmagnetic spacer layer 232, a pinned layer 234 and another AFM layer 236. The AFM layer 236 and 224 preferably include PtMn, but may also include PdPtMn, NiMn, IrMn or other AFM materials. The pinned layers 226 and 234 and free layer 230 are ferromagnetic. The free layer 230 and pinned layers 226 and 234 may include Co, Fe, Ni or their alloys, such as CoFe, CoNi, CoFeNi and NiFe. Alternatively, the free layer 230 may be synthetic. In addition, a small concentration of Cr, Cu, Pt, Ti and/or other nonmagnetic materials can be doped into the ferromagnetic materials for improving the thermal stability of the magnetic element 200 as well as for optimizing properties such as magnetostriction, saturation magnetization, bulk spin asymmetry coefficient and magnetic damping constants. The ferromagnetic layers 226, 230 and 234 may also include half-metallic materials, such as $CrO_2$, $Sr_2FeMoO_6$, $(La_{0.7}Sr_{0.3})MnO_3$, and NiMnSb or laminated ferromagnetic and half-metallic layers. The nonmagnetic spacer layers 228 and 232 are preferably conductive and include, but are not limited to, materials such as Cu. In the preferred embodiment, the free layer 230 of the spin valve 204 is written to using spin transfer, while the spin tunneling junction 202 of the magnetic element 200 is used to read the magnetic element 200.

The dual spin valve 208 includes an AFM layer 240, a pinned layer 242, a nonmagnetic spacer layer 244, a free layer 246, a nonmagnetic spacer layer 248, and a pinned layer 250. The materials used for the dual spin valve 208 are preferably analogous to those used in the similar components in the dual spin valve 204. In the preferred embodiment, the free layer 246 of the spin valve 208 is written to using spin transfer. The free layer 222 of the spin tunneling junction responds magnetostatically to the free layer 246 of the spin valve 208, while the spin tunneling junction 202 of the magnetic element 200 is used to read the magnetic element 200.

The magnetic element 200 is configured to allow the magnetization of the free layers 222 and 230 to be switched using spin transfer. Consequently, the dimensions of the magnetic element 200 are small, in the range of few hundred nanometers. In a preferred embodiment, the width (parallel to the plane of the page in FIG. 6) of the magnetic element 200 is less than two hundred nanometers and preferably approximately one hundred nanometers. The magnetic element 200 preferably has a depth, perpendicular to the plane of the page in FIG. 6, of approximately fifty nanometers. The depth is preferably smaller than the width of the magnetic element 200 so that the magnetic element 200 has some shape anisotropy, ensuring that one or more of the free layers 222 and 230 has a preferred direction. In addition, the thicknesses of the free layer(s) 222 and 230 is small enough that the spin transfer is strong enough to rotate the free layer magnetization into and out of alignment with the magnetization of the pinned layers 212, 228, 234, 242, and 250. In a preferred embodiment, the free layers 222 and 230 have a thickness of less than five nm.

The separation layer 206 is preferably a nonmagnetic conductive layer. Thus, the separation layer 206 can include materials such as Cu, Au or Ag. The separation layer is thick enough to preclude interlayer exchange coupling of the free layer 222 and ferromagnetic layers in the dual spin valve 204. This thickness is preferably at least one five to fifty Angstroms. Furthermore, the separation layer 206 has a thickness that allows for magnetostatic coupling between the free layer 222 and the free layer 230. In a preferred embodiment, the free layer 222 and the free layer 230 are magnetostatically coupled to be antiparallel, as shown in FIG. 6. Similarly, the free layer 222 is magnetostatically coupled to the free layer 246 to be antiparallel to the free layer 246. In the preferred embodiment the free layers 230 and 246 are not magnetostatically coupled.

Also in a preferred embodiment, the geometry of the layers of the magnetic element is tailored to reduce the magnetic interactions from ferromagnetic layers 212, 222, 226, 230, 234, 242, 246, and 250 other than the free layers 222, 230, and 246 on the free layers 222, 230, and 246. For example, assume that the magnetic element 200 has a width, w, and a depth (out of the page) d, and that the free layers 222 and 230 have thicknesses $t_1$ and $t_2$, respectively. Also assume that the magnetizations of the first free layer 222 and the second free layer 230 are $M_1$ and $M_2$, respectively. The thicknesses of the ferromagnetic layers 212, 222, 226, 230, 234, 242, 246, and 250, the nonmagnetic spacer layers 228 and 248, and the barrier layer 220 are elected to balance the interaction and demagnetization fields of the ferromagnetic layers 212, 222, 226, 230, 234, 242, 246, and 250 so that the free layers 222 and 230 do not experience a strong net bias from the ferromagnetic layers 212, 222, 226, 230, 234, 242, 246, and 250. In other words, the total of the magnetostatic field and the interlayer and static coupling fields from layers other than the free layers 222 and 230 preferably sum to zero to reduce the bias on the free layers 222 and 230. In addition, the geometry of the free layers 222, 230, and 246 is tailored to ensure that the free layer 222 switches to remain antiparallel to the free layers 230 and 246 when the other free layer 230 and 246 are switched using spin transfer.

In operation, the magnetic element 200 is written by driving current in a CPP configuration and exploiting spin transfer. Currently, the spin transfer phenomenon is predominantly provided using the spin valves 204 and 208. In particular, a current can be driven in a direction from the spin tunneling junction 202 through the dual spin valve 204. Electrons, therefore, travel down from the spin valve 204 through the spin tunneling junction 202 and through the dual spin valve 208. For this case the free layers 230 and 246 are assumed to be initially parallel to pinned layers 226 and 242, respectively. The current injected from the top pinned layers 234 and 250 toward free layers 230 and 246 corresponds to electrons spin polarized in the direction of magnetization of the pinned layer 234 and the pinned layer 250. The electrons from the pinned layer 234 can transfer a portion of their angular momentum to the free layer 230. Likewise electrons from the pinned layer 250 can transfer a portion of their angular momentum to the free layer 246. In addition to this forward spin transfer torque, the free layers 230 and 246 receive a torque from reflected electrons. Electrons transmitted through free layers 230 and 246 become polarized in the direction of the free layers 230 and 246, respectively. The minority electrons reflect off of pinned layers 226 and 242 and return to free layers 230 and 246, respectively, where they transfer a portion of their angular momentum to free layers 230 and 246, respectively. This torque from the reflected electrons is in the same direction as the torque from the forward electrons due to the antiparallel alignment of the pinned layers within each spin valve. The combination of the forward and reflected electrons thus can set the magnetization of the free layer 230 in the same direction as the magnetization of the pinned layer 234 and can set the magnetization of free layer 246 in the same direction as the magnetization of the pinned layer 242. As can be seen in FIG. 6, the pinned layer 234 is oriented in the same direction as the pinned layer 250. Thus, the magnetization of the free layers 230 and 246 remain parallel after switching. However, the magnetization of the free layer 222 is magnetostatically coupled to be antiparallel to the magnetizations of the free layers 230 and 246. Consequently, the magnetization of the free layer 222 switches to be antiparallel to the magnetizations of the free layers 230 and 246.

For the case in which the current is driven in the opposite direction, the magnetization of the free layers 230 and 246 are assumed to be initially parallel to the magnetization of the pinned layer 234 and 250, respectively. Current is driven from the spin valve 204 to the spin tunneling junction 202, then to the spin valve 208, with electrons traveling in the opposite direction. This current injected from the bottom pinned layers 226 and 242 toward free layers 230 and 246, respectively, corresponds to electrons spin polarized in the direction of magnetization of the pinned layer 226 and the pinned layer 242, respectively. The electrons from the pinned layer 226 can transfer a portion of their angular momentum to the free layer 230. Likewise electrons from the pinned layer 242 can transfer a portion of their angular momentum to the free layer 246. In addition to this forward spin transfer torque, the free layers 230 and 246 receive a torque from reflected electrons. Electrons transmitted through free layers 230 and 246 become polarized in the direction of the free layer 230 and 246, respectively. The minority electrons reflect off of pinned layers 234 and 250 and return to free layers 230 and 246, respectively, where they transfer a portion of their angular momentum to free layers 230 and 246, respectively. This torque from the reflected electrons is in the same direction as the torque from the forward electrons because of the antiparallel alignment of the pinned layers within each spin valve. The combination of the forward and reflected electrons can set the magnetization of the free layer 230 in the same direction as the magnetization of the pinned layer 226 and can set the magnetization of free layer 246 in the same direction as the magnetization of the pinned layer 242. As can be seen in FIG. 6, the pinned layer 226 is oriented in the same direction as the pinned layer 242. Thus, the magnetization of the free layers 230 and 246 remain parallel after switching. However, the magnetization of the free layer 222 is magnetostatically coupled to be antiparallel to the magnetizations of the free layers 230 and 246. Consequently, the magnetization of the free layer 222 switches to be antiparallel to the magnetizations of the free layers 230 and 246. Due to the magnetostatic coupling, the magnetization of the free layer 222 of the spin tunneling junction 202 also switches to remain antiparallel to the magnetization of the free layers 230 and 246.

During reading, the properties of the spin tunneling junction 202 and the magnetostatic coupling between the free layers 222, 230, and 246 are exploited. Because of the insulating barrier 220, the resistance of the spin tunneling junction 202 is large. Thus, the spin tunneling junction 202 dominates the output signal. Because of the magnetostatic coupling between the free layers 230 and 246, the magnetization of the free layer 222 of the spin tunneling junction 202 is related to the direction of magnetization of the free layers 230 and 246 of the spin valves 204 and 208, respectively. Consequently, the spin tunneling junction 202 can be used to read data stored in the free layers 230 and 246 using spin transfer. This is true even though the spin transfer phenomenon may not be capable of writing to the free layer 222 of the spin tunneling junction 202.

Depending upon the direction of the magnetization of the free layer 222 with respect to the magnetization of the pinned layer 212, the resistance of the spin tunneling junction 202 will be either low (free layer 222 magnetization parallel to ferromagnetic layer 218 magnetization) or high (free layer 222 magnetization antiparallel to ferromagnetic layer 218 magnetization). As stated above, because of its high resistance, the spin tunneling junction 202 dominates the signal of the magnetic element 200. By driving a read current in a CPP configuration, the resistance state of the spin tunneling junction 202 can be determined. Note, however, that the read current is substantially less than the current used to write to the magnetic element 200 in order to prevent inadvertent writing of the magnetic element 200. In a preferred embodiment, the read current is an order of magnitude less than the write current.

Consequently, spin transfer can be used to write to magnetic element 200. As a result, a switching field driven by an external current is unnecessary. Instead, a more localized and reliable phenomenon, spin transfer, is used to write to both the dual spin valves 204 and 208 of the magnetic element 200. Furthermore, because of the magnetostatic coupling between the free layer 222 and the free layers 230 and 246, the directions of magnetization of the free layers 222, 230 and 246 are related. As a result, the spin tunneling junction 202 can be used to read the data that has been written to the spin valves 204 and 208, as well as the data written to the spin tunneling junction 202. Consequently, a higher output signal is achieved.

Figure 7:
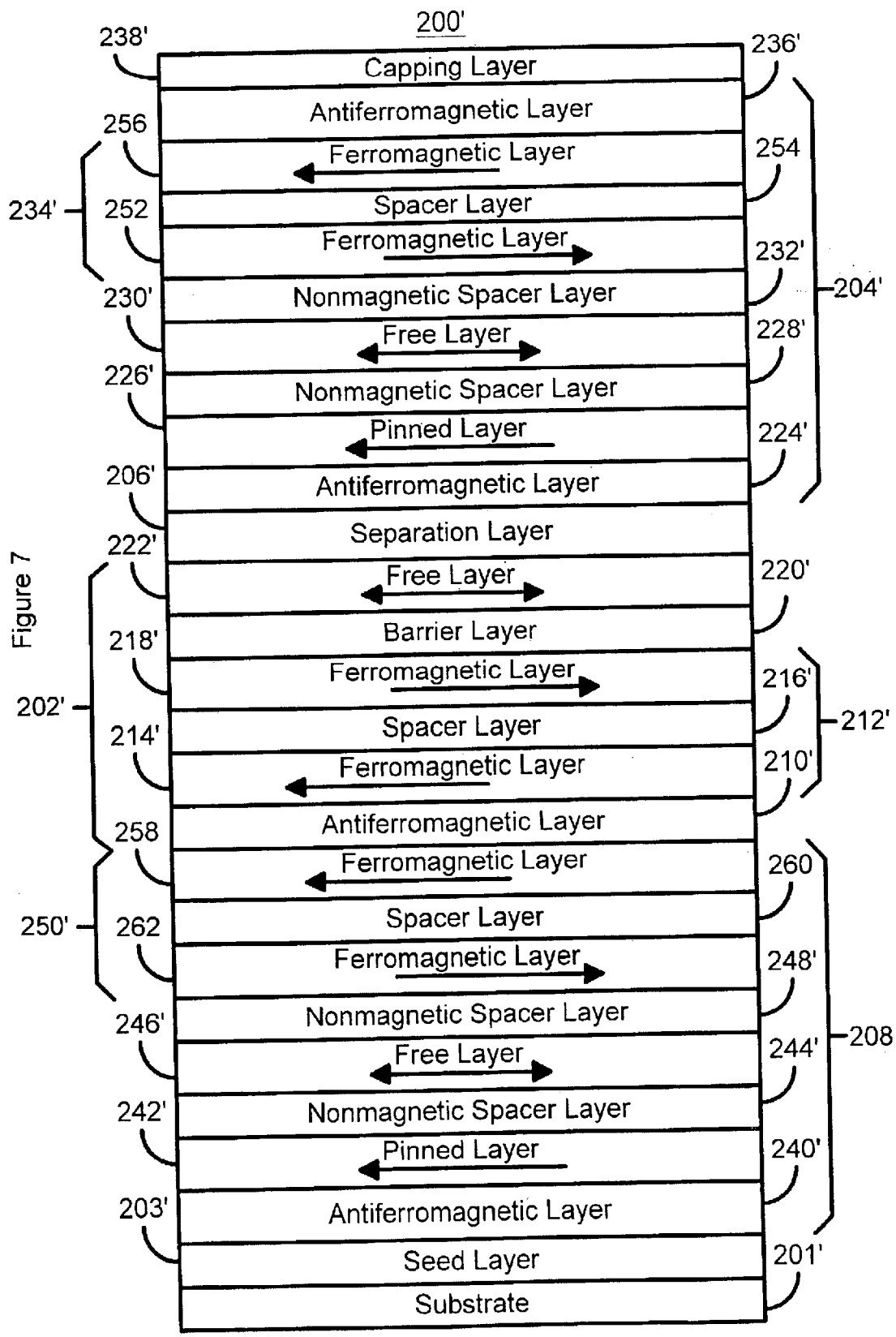
FIG. 7 is a diagram depicting a fifth embodiment of a magnetic element in accordance with the present invention.

FIG. 7 is a diagram depicting a fifth embodiment of a magnetic element 200' in accordance with the present invention. The magnetic element 200' has many of the same components as the magnetic element 200' depicted in FIG. 6. Consequently, analogous structures are labeled similarly for the magnetic element 200 depicted in FIG. 6. However, the dual spin valves 204' and 208' include synthetic pinned layers 234' and 250', respectively. The synthetic pinned layer 234' includes ferromagnetic layers 252 and 256 separated by a spacer layer 254. The synthetic pinned layer 250' includes ferromagnetic layers 258 and 262, separated by a spacer layer 260. The magnetic element 200' thus functions in essentially the same manner as the magnetic element 200.

Figure 8:
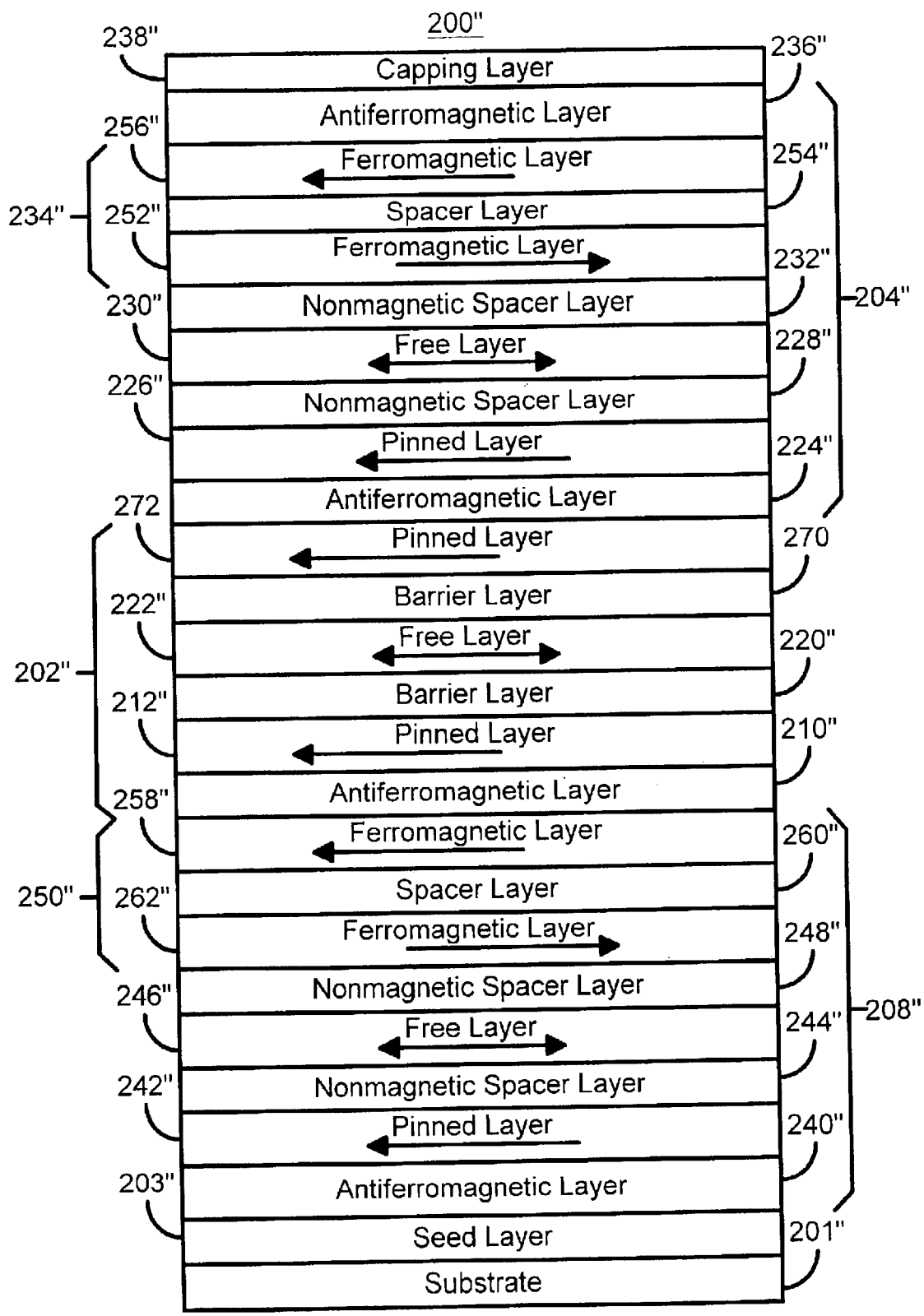
FIG. 8 is a diagram depicting a sixth embodiment of a magnetic element in accordance with the present invention.

FIG. 8 is a diagram depicting a fifth embodiment of a magnetic element 200" in accordance with the present invention. The magnetic element 200" has many of the same components as the magnetic element 200" depicted in FIG. 7. Consequently, analogous structures are labeled similarly for the magnetic element 200' depicted in FIG. 7. However, the spin tunneling junction 202" is a dual spin tunneling junction 202" including additional layers: an additional barrier layer 270 and a pinned layer 272. The antiferromagnetic layer 224" is shared between the dual spin valve 204" and the dual spin tunneling junction 202". In addition, the separation layer 206 is omitted. Thus, the requisite spacing for desired magnetostatic coupling between the free layers 230" and 222" is provided without the use of the separation layer 206 depicted in FIGS. 6 and 7. Referring back to FIG. 8, the magnetic element 200" thus functions in essentially the same manner as the magnetic element 200'. However, because of the use of a dual spin tunneling junction 202", which has two barrier layers 220" and 270, the read signal is increased. Consequently, in addition to the benefits achieved by the magnetic element 200", the read signal can be improved.

Figure 9:
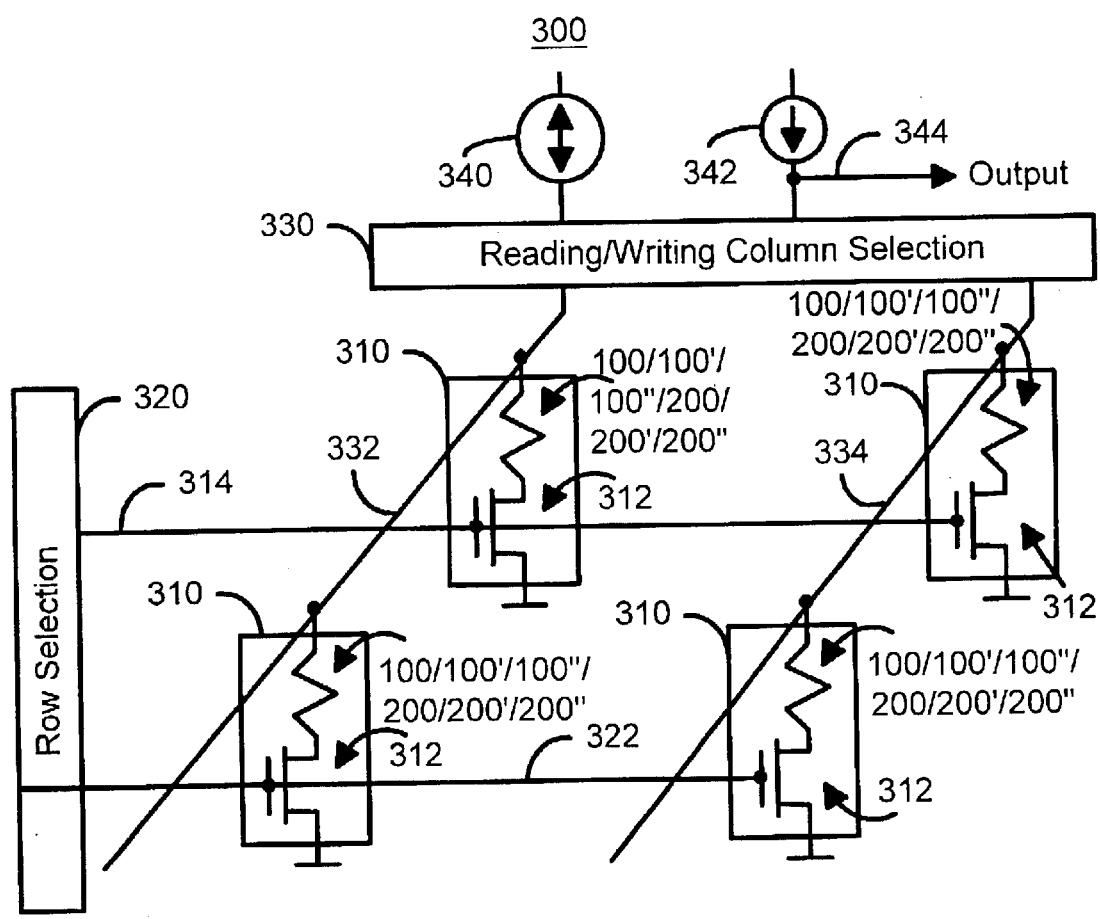
FIG. 9 is a diagram depicting one embodiment of a magnetic memory in accordance with the present invention using the magnetic element in accordance with the present invention.

FIG. 9 is a diagram depicting one embodiment of a magnetic memory 300 in accordance with the present invention using the magnetic elements 100, 100', 100", 200, 200', and/or 200" in accordance with the present invention. The magnetic memory array 300 is for exemplary purposes only and thus depicts a memory array 300 in which the magnetic elements 100, 100', 100", 200, 200', and/or 200" may be more directly incorporated into a conventional memory. Thus, each memory cell 310 includes a magnetic element 100, 100', 100", 200, 200', and/or 200" and a transistor 312. The magnetic memory array 300 also includes row selection mechanism 320, column selection mechanism 330, word lines 322 and 314, and bit lines 332 and 334. The magnetic memory array 300 further includes write current source 340 and read current source 342. However, the magnetic memory array 300 does not include any write lines.

Because spin transfer is used to write to the magnetic elements 100, 100', 100", 200, 200', and/or 200", additional lines, such as write lines 60 and 62 of the conventional memory 10, depicted in FIG. 2, are unnecessary. Consequently, the density of the magnetic memory 300 may be further increased without high power consumption and other issues due to the use of the conventional write operation to write the conventional memory elements 1 and 1'. In addition, the circuitry used to write to the magnetic elements 100, 100', 100", 200, 200', and/or 200" can be simplified because of the omission of separate write lines.

Figure 10:
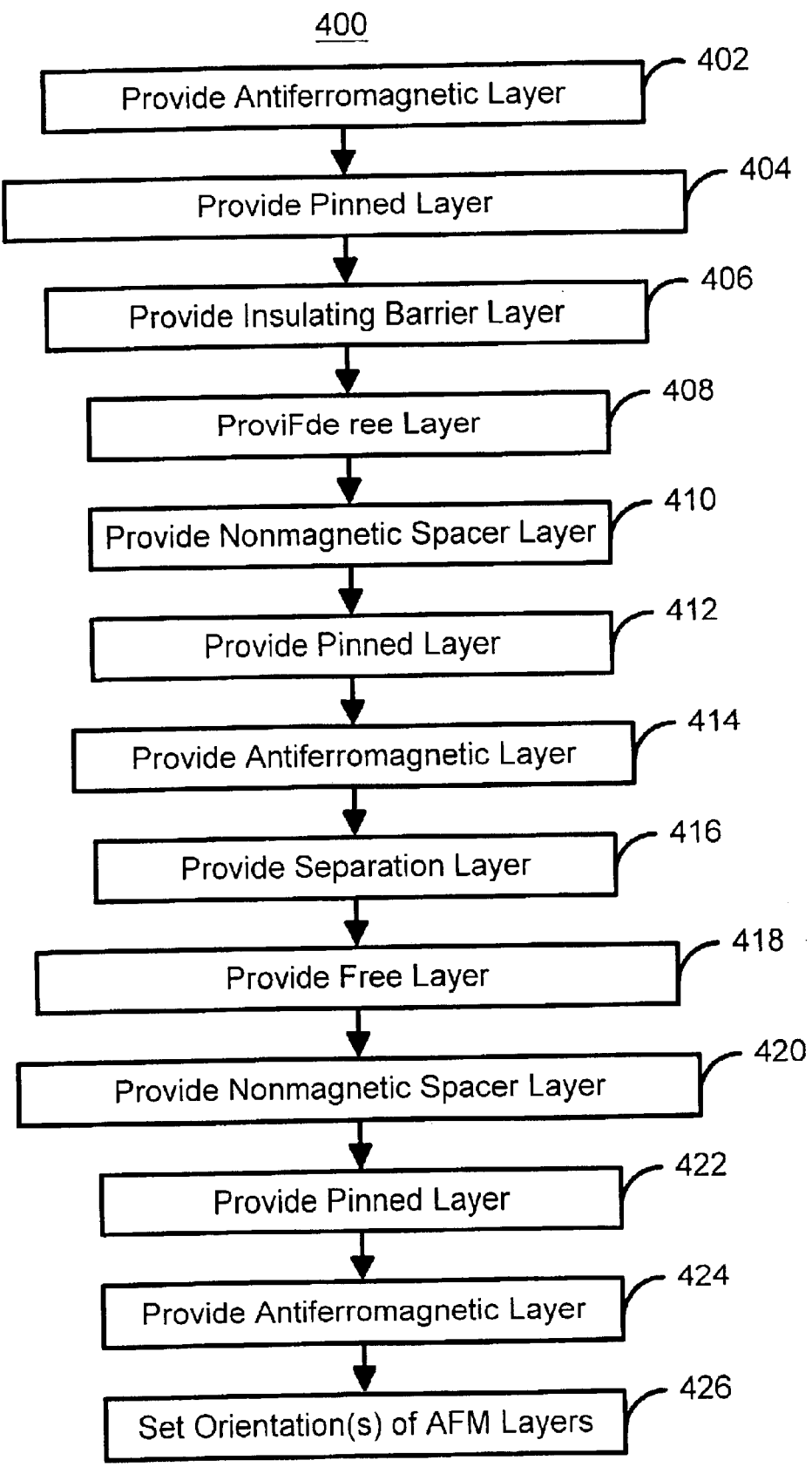
FIG. 10 is a flow chart depicting a first embodiment of a method in accordance with the present invention for providing a magnetic element in accordance with the present invention.

FIG. 10 is a high-level flow chart depicting one embodiment of a method 400 in accordance with the present invention for providing magnetic elements in accordance with the present invention. For clarity, the method 400 is described in the context of the materials layer sequence of magnetic element 100. However, the method 400 could be adapted to other magnetic elements, such as the materials layers outlined in 100' and 100". For example, additional steps could be added to form one or more dual spin valves. The dual spin tunnel/valve structure 102 is provided, via step 402–414. The AFM layer 110 is provided, via step 402. In a preferred embodiment, the AFM layer 110 is provided on the appropriate seed layer 108. The pinned layer 112 and the barrier layer 120 are provided in steps 404 and 406, respectively. Step 404 could also include providing ferromagnetic layers 114 and 118 separated by the spacer layer 116 such that the pinned layer 112 is synthetic. The free layer 122 is provided in step 408. Step 408 could include providing a synthetic free layer. The nonmagnetic spacer layer 124 and a pinned layer 126 are provided, via steps 410 and 412, respectively. The AFM layer 128 is provided, via step 414. Thus, the dual spin tunnel/valve structure 102 is formed.

The separation layer 106 is provided, via step 416. The spin valve 104 is provided, via steps 418–426. The free layer 130 is provided, via step 418. Step 418 could include providing a synthetic free layer. The nonmagnetic spacer layer 132 is provided, via step 420. The pinned layer 134 and AFM layer 142 are provided, via steps 422 and 424, respectively. The orientation(s) of the AFM layers 110 and 142 may be set, via step 426. Step 426 could include independently setting the orientations of the AFM layers 110 and 142. Alternatively, step 426 could set the orientations of the antiferromagnetic layers 110 and 142 together. Other processing for the magnetic element 100 could then be completed. Thus, using the method 400, the magnetic element 100 may be fabricated.

Figure 11:
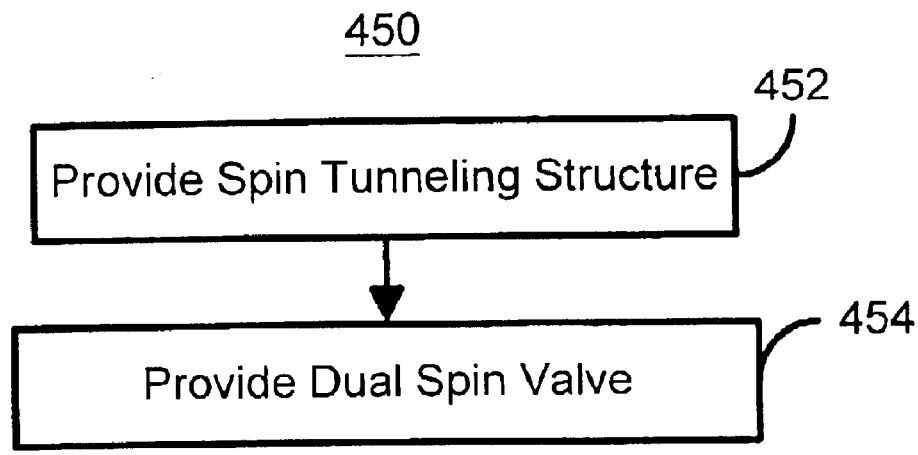
FIG. 11 is a flow chart depicting a second embodiment of a method in accordance with the present invention for providing a magnetic element in accordance with the present invention.

FIG. 11 is a flow chart depicting a second embodiment of a method 450 in accordance with the present invention for providing a magnetic element, such as the magnetic element 100' in accordance with the present invention. Because many of the steps are similar to the method 400, the method 450 will be described at a high level. For clarity, the method 450 is described in the context of the materials layer sequence of magnetic element 100'. However, the method 450 could be adapted to other magnetic elements. The dual spin tunnel/valve structure 102' is provided, via step 452. Step 452 preferably includes providing the AFM layer 110' on the appropriate seed layer 108', providing the pinned layer 112', providing the barrier layer 120', providing the free layer 122', providing the nonmagnetic spacer layer 124', providing a pinned layer 126', and the AFM layer 128'. Thus, the dual spin tunnel/valve structure 102' is formed.

A dual spin valve 104' is provided, via step 454. However, in a preferred embodiment, the dual spin valve 104' shares the AFM layer 128' with the dual spin tunnel/valve structure 102'. Thus, step 454 includes providing the pinned layer 146', the nonmagnetic spacer layer 148, the free layer 130', the nonmagnetic spacer layer 132', the pinned layer 134' and the AFM layer 142'. One or more of the ferromagnetic layers 112', 122', 126', 146', 130', and 134' could be synthetic. Other processing for the magnetic element 100' could then be completed. Thus, using the method 450, the magnetic element 100' may be fabricated.

Figure 12:
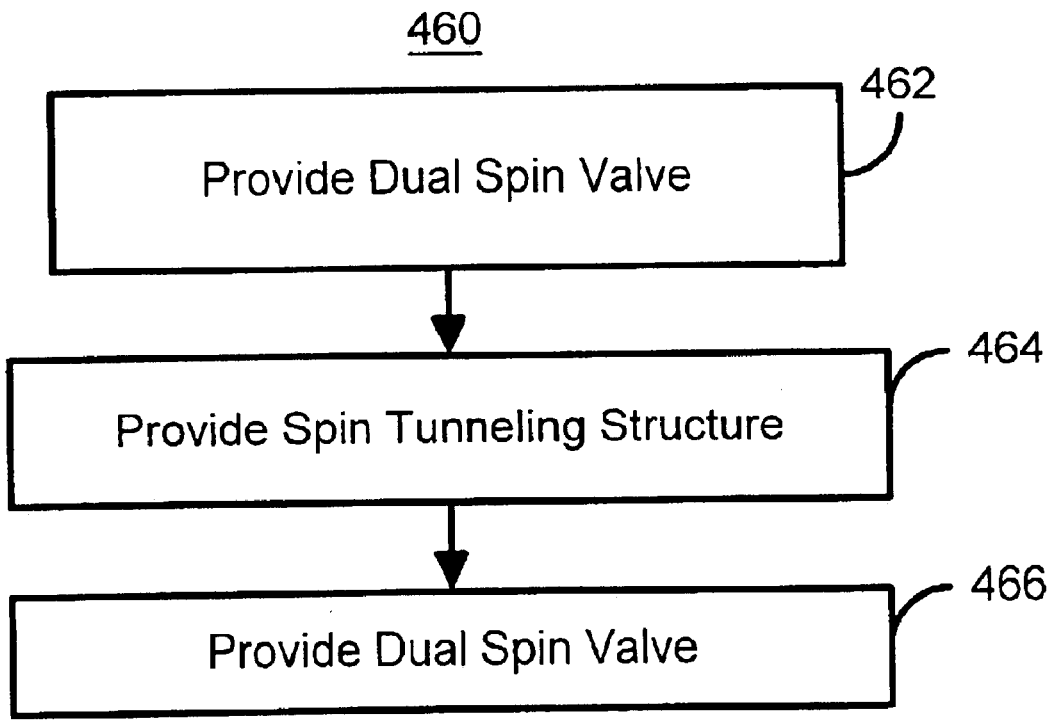
FIG. 12 is a flow chart depicting a third embodiment of a method in accordance with the present invention for providing a magnetic element in accordance with the present invention.

FIG. 12 is a flow chart depicting a third embodiment of a method 460 in accordance with the present invention for providing a magnetic element, such as the magnetic element 100", in accordance with the present invention. Because many of the steps are similar to the methods 400 and 450, the method 460 will be described at a high level. For clarity, the method 460 is described in the context of the materials layer sequence of magnetic element 100". However, the method 460 could be adapted to other magnetic elements.

The dual spin valve 150 is provided, via step 462. Step 462 includes providing the AFM layer 168 on the appropriate seed layer 108", the pinned layer 166, the nonmagnetic spacer layer 164, the free layer 162, the nonmagnetic spacer layer 160 and the pinned layer 152. In one embodiment, step 462 could include providing the AFM layer 110". However, in an alternate embodiment, the AFM layer 110" could be considered to be provided with the dual spin tunnel/valve structure 102".

The dual spin tunnel/valve structure 102" is provided, via step 464. Step 464 preferably includes providing the AFM layer 110", providing the pinned layer 112", providing the barrier layer 120", providing the free layer 122", providing the nonmagnetic spacer layer 124", providing a pinned layer 126", and providing the AFM layer 128". Thus, the dual spin tunnel/valve structure 102" is formed.

A dual spin valve 104" is provided, via step 466. In a preferred embodiment, the dual spin valve 104" shares the AFM layer 128" with the dual spin tunnel/valve structure 102". Thus, step 466 includes providing the pinned layer 146", the nonmagnetic spacer layer 148", the free layer 130", the nonmagnetic spacer layer 132", the pinned layer 134" and the AFM layer 142". One or more of the ferromagnetic layers 112", 122", 126", 146', 130", 134", 160, 162 or 166 could be synthetic. Other processing for the magnetic element 100" could then be completed. Thus, using the method 460, the magnetic element 100" may be fabricated.

Figure 13:
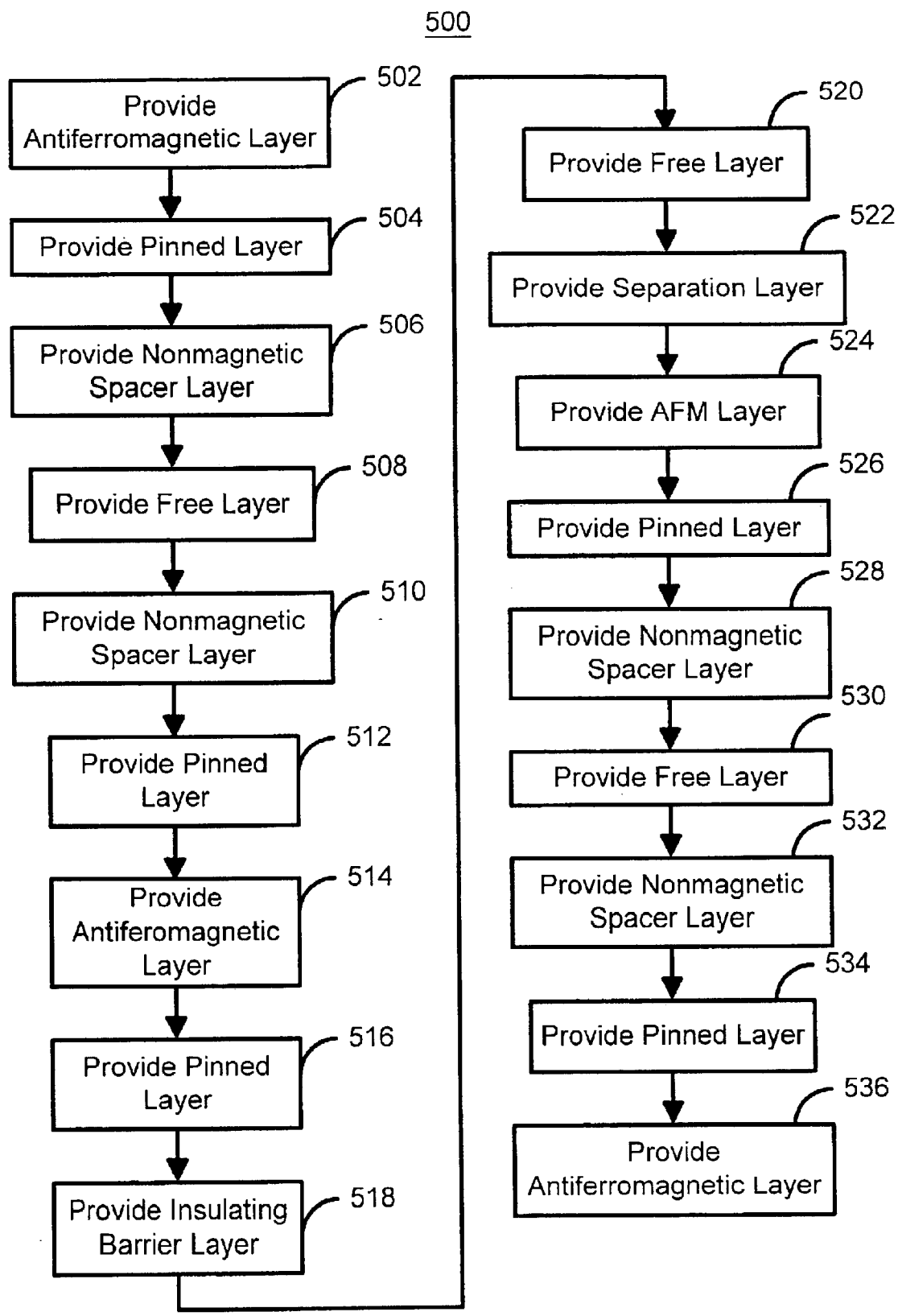
FIG. 13 is a flow chart depicting a fourth embodiment of a method in accordance with the present invention for providing a magnetic element in accordance with the present invention.

FIG. 13 is a flow chart depicting a fourth embodiment of a method 500 in accordance with the present invention for providing a magnetic element, such as the magnetic element 200, in accordance with the present invention. For clarity, the method 500 is described in the context of the materials layer sequence of magnetic element 200. However, the method 500 could be adapted to other magnetic elements, such as the materials layers outlined in 200' and 200". For example, additional steps could be added to form one or more dual spin valves.

The dual spin valve 208 is provided, via steps 502–514. The AFM layer 240 is provided, via step 502. In a preferred embodiment, the AFM layer 240 is provided on the appropriate seed layer 203. The pinned layer 242 and the nonmagnetic spacer layer 244 are provided in steps 504 and 506, respectively. Step 504 could also include providing a synthetic pinned layer 242 (not shown). The free layer 246 is provided in step 508. Step 508 could include providing a synthetic free layer. The nonmagnetic spacer layer 248 and a pinned layer 250 are provided, via steps 510 and 512, respectively. Step 510 could include providing a synthetic pinned layer, such as the synthetic pinned layer 250' depicted in FIG. 7. Referring back to FIGS. 6 and 13, the AFM layer 210 is provided, via step 514. However, in another embodiment, the step 514 of providing the AFM layer 210 could be considered to be part of forming the spin tunneling junction 202'. Thus, the dual spin valve 208 is formed.

The spin tunneling junction 202 is provided, via step 516–520. The AFM layer 210 has already been provided in step 514. The pinned layer 212 and the barrier layer 220 are provided in steps 516 and 518, respectively. Step 516 could also include providing ferromagnetic layers 214 and 218 separated by the spacer layer 216 such that the pinned layer 212 is synthetic. The free layer 222 is provided in step 520. Step 520 could include providing a synthetic free layer. Thus, the spin tunneling junction 202 is formed.

The separation layer 206 is provided, via step 522. The dual spin valve 204 is provided, via steps 524–536. The AFM layer 224 is provided, via step 524. The pinned layer 226 and the nonmagnetic spacer layer 228 are provided in steps 526 and 528, respectively. Step 526 could also include providing a synthetic pinned layer 226 (not shown). The free layer 230 is provided in step 530. Step 530 could include providing a synthetic free layer. The nonmagnetic spacer layer 232 and a pinned layer 234 are provided, via steps 532 and 534, respectively. Step 534 could include providing a synthetic pinned layer, such as the synthetic pinned layer 234' depicted in FIG. 7. Referring back to FIGS. 6 and 13, the AFM layer 238 is provided, via step 536. Thus, the dual spin valve 204 is formed.

Figure 14:
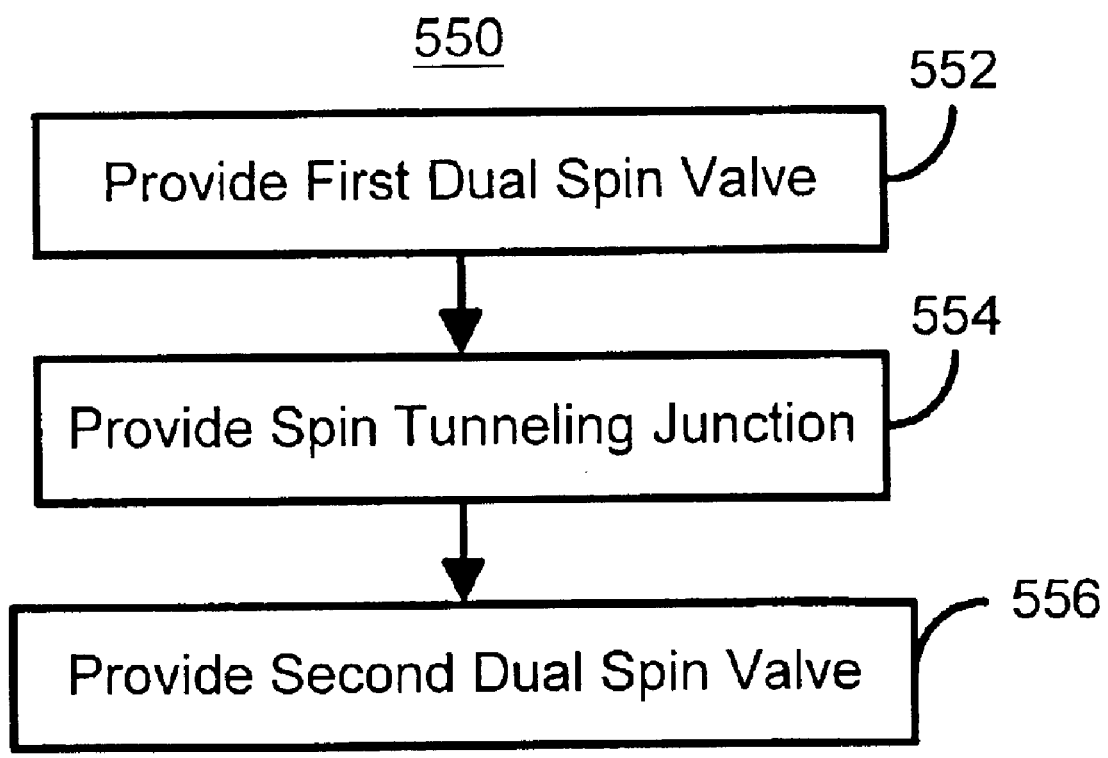
FIG. 14 is a flow chart depicting a fifth embodiment of a method in accordance with the present invention for providing a magnetic element in accordance with the present invention.

FIG. 14 is a flow chart depicting a fifth embodiment of a method 550 in accordance with the present invention for providing a magnetic element, such as the magnetic element 200", in accordance with the present invention. Because many of the steps are similar to the method 500, the method 550 will be described at a high level. For clarity, the method 550 is described in the context of the materials layer sequence of magnetic element 200". However, the method 550 could be adapted to other magnetic elements.

The dual spin valve 208" is provided, via step 552. Step 552 includes providing the AFM layer 240" on the appropriate seed layer 203", the pinned layer 242", the nonmagnetic spacer layer 244", the free layer 246", the nonmagnetic spacer layer 248" and the pinned layer 250". In one embodiment, step 552 could include providing the AFM layer 210" . However, in an alternate embodiment, the AFM layer 210" could be considered to be provided with the spin tunneling junction 202".

The spin tunneling junction 202" is provided, via step 554. The spin tunneling junction 202" is a dual spin tunneling junction. Step 554 preferably includes providing the AFM layer 210", providing the pinned layer 212", providing the barrier layer 220", providing the free layer 222", providing the other barrier layer 270, providing another pinned layer 272 and providing the AFM layer 222". Thus, the dual spin tunneling junction 202" is formed.

The dual spin valve 204" is provided, via step 556. In a preferred embodiment, the dual spin valve 204" shares the AFM layer 224" with the spin tunneling junction 202". Thus, step 566 includes providing the pinned layer 226", the nonmagnetic spacer layer 228", the free layer 230", the nonmagnetic spacer layer 232", the pinned layer 234" and the AFM layer 236". One or more of the ferromagnetic layers 212", 222", 226", 230", 234", 242", 246", 250", or 272 could be synthetic. Other processing for the magnetic element 200" could then be completed. Thus, using the method 550, the magnetic element 200" may be fabricated.

A method and system has been disclosed for providing a magnetic element that can be written using spin transfer, and thus a smaller and localized switching current, and which provides an adequate read signal. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A magnetic element comprising:
    a spin tunneling structure including a first pinned layer, a barrier layer, a first free layer, a first nonmagnetic spacer layer, and a second pinned layer, the first pinned layer being ferromagnetic and having a first pinned layer magnetization, the first pinned layer magnetization being pinned in a first direction, the barrier layer being an insulator and having a thickness that allows tunneling through the barrier layer, the barrier layer being disposed between the first pinned layer and the first free layer, the first free layer being ferromagnetic and having a first free layer magnetization, the first nonmagnetic spacer layer being conductive and disposed between the second pinned layer and the first free layer, the second pinned layer being ferromagnetic and having a second pinned layer magnetization pinned in a second direction;

a spin valve structure having a third pinned layer, a second nonmagnetic spacer layer and a second free layer, the third pinned layer being ferromagnetic and having a third pinned layer magnetization, the third pinned layer magnetization being pinned in a third direction, the second free layer being ferromagnetic and having a second free layer magnetization, the second nonmagnetic spacer layer being conductive and residing between the second free layer and the second pinned layer, the first free layer and the second free layer being disposed such that the first free layer and the second free layer are magnetostatically coupled;

wherein the magnetic element is configured to allow the first and/or second free layer magnetization to change direction due to spin transfer when a write current is passed through the magnetic element.

2. The magnetic element of claim 1 further comprising:
a separation layer residing between the first free layer of the spin tunneling structure and the second free layer of the spin valve, the separation layer being configured to allow the first free layer and the second free layer to be magnetostatically coupled.

3. The magnetic element of claim 2 further comprising:
an antiferromagnetic layer adjacent to the second pinned layer, the antiferromagnetic layer for pinning the second pinned layer magnetization; and wherein the separation layer resides between and adjacent to the antiferromagnetic layer and the second free layer.

4. The magnetic element of claim 1 wherein the first free layer and the second free layer are magnetostatically coupled such that the first free layer magnetization is antiparallel to the second free layer magnetization.

5. The magnetic element of claim 1 wherein the first pinned layer is a synthetic pinned layer including a first ferromagnetic layer and a second ferromagnetic layer separated by a nonmagnetic layer, the first ferromagnetic layer and the second ferromagnetic layer being antiferromagnetically coupled.

6. The magnetic element of claim 1 wherein the third pinned layer is a synthetic pinned layer including a first ferromagnetic layer and a second ferromagnetic layer separated by a nonmagnetic layer, the first ferromagnetic layer and the second ferromagnetic layer being antiferromagnetically coupled.

7. The magnetic element of claim 1 wherein the spin valve is a dual spin valve and further includes a fourth pinned layer and a third nonmagnetic spacer layer disposed between the second free layer and the fourth pinned layer, the second free layer residing between the fourth pinned layer and the third pinned layer, the fourth pinned layer being magnetic and having a fourth pinned layer magnetization pinned in a fourth direction.

8. The magnetic element of claim 7 wherein the first pinned layer is a synthetic pinned layer including a first ferromagnetic layer and a second ferromagnetic layer separated by a nonmagnetic layer, the first ferromagnetic layer and the second ferromagnetic layer being antiferromagnetically coupled.

9. The magnetic element of claim 7 wherein the fourth pinned layer is a synthetic pinned layer including a first ferromagnetic layer and a second ferromagnetic layer separated by a nonmagnetic layer, the first ferromagnetic layer and the second ferromagnetic layer being antiferromagnetically coupled.

10. The magnetic element of claim 7 further comprising:
a second dual spin valve including a fifth pinned layer, a fourth nonmagnetic spacer layer, a third free layer, a fifth nonmagnetic spacer layer, and a sixth pinned layer, the fourth nonmagnetic spacer layer residing between the fifth pinned layer and the third free layer, the third free layer residing between the fifth pinned layer and the sixth pinned layer, the fifth nonmagnetic spacer layer residing between the third free layer and the sixth pinned layer, the fifth pinned layer having a fifth pinned layer magnetization pinned in a fifth direction, the sixth pinned layer having a sixth pinned layer magnetization pinned in a sixth direction, the third free layer having a third free layer magnetization, the first free layer and the third free layer being disposed such that the first free layer and the third free layer are magnetostatically coupled.

11. The magnetic element of claim 10 wherein the first free layer and the third free layer are magnetostatically coupled such that the first free layer magnetization is antiparallel to the third free layer magnetization.

12. A magnetic element comprising:
a spin tunneling junction having a first pinned layer, a barrier layer, and a first free layer, the barrier layer residing between the first pinned layer and the first free layer, the first pinned layer being ferromagnetic and having a first pinned layer magnetization pinned in a first direction, the first free layer being ferromagnetic and having a first free layer magnetization, the barrier layer being an insulator and having a first thickness that allow tunneling through the barrier layer;

a first dual spin valve having a second pinned layer, a first nonmagnetic spacer layer, a second free layer, a second nonmagnetic spacer layer and a third pinned layer, the second pinned layer residing between the second free layer and the first free layer, the first nonmagnetic spacer residing between the second pinned layer and the second free layer, the second free layer residing between the second pinned layer and the third pinned layer, the second nonmagnetic spacer layer residing between the second free layer and the third pinned layer, the second pinned layer being ferromagnetic and having a second pinned layer magnetization pinned in a second direction, the third pinned layer being ferromagnetic and having a third pinned layer magnetization pinned in a third direction, the second free layer being ferromagnetic and having a second free layer magnetization, the first free layer and the second free layer being magnetostatically coupled, the first nonmagnetic spacer layer being conductive;

a second dual spin valve having a fourth pinned layer, a third nonmagnetic spacer layer, a third free layer, a fourth nonmagnetic spacer layer and a fifth pinned layer, the fourth pinned layer residing between the first free layer and the third free layer, the third nonmagnetic spacer residing between the fourth pinned layer and the third free layer, the fourth nonmagnetic spacer residing between the third free layer and the fifth pinned layer, the fourth pinned layer being ferromagnetic and having a fourth pinned layer magnetization pinned in a fourth direction, the fifth pinned layer being ferromagnetic and having a fifth pinned layer magnetization pinned in a fifth direction, the third free layer being ferromagnetic and having a third free layer magnetization, the first free layer and the third free layer being magnetostatically coupled;

wherein the magnetic element is configured to allow the second free layer magnetization and the third free layer magnetization to change direction due to spin transfer when a write current is passed through the magnetic element.

13. The magnetic element of claim 12 further comprising:
a separation layer residing between the first free layer of the spin tunneling junction and the second pinned layer of the first dual spin valve, the separation layer being configured to allow the first free layer and the second free layer to be magnetostatically coupled.

14. The magnetic element of claim 13 wherein the first free layer and the second free layer are magnetostatically coupled such that the first free layer magnetization is antiparallel to the second free layer magnetization.

15. The magnetic element of claim 14 wherein the first free layer and the third free layer are magnetostatically coupled such that the first free layer magnetization is antiparallel to the third free layer magnetization.

16. The magnetic element of claim 12 wherein the first pinned layer is a synthetic pinned layer including a first ferromagnetic layer and a second ferromagnetic layer separated by a nonmagnetic layer, the first ferromagnetic layer and the second ferromagnetic layer being antiferromagnetically coupled.

17. The magnetic element of claim 12 wherein the third pinned layer is a synthetic pinned layer including a first ferromagnetic layer and a second ferromagnetic layer separated by a nonmagnetic layer, the first ferromagnetic layer and the second ferromagnetic layer being antiferromagnetically coupled.

18. The magnetic element of claim 12 wherein the fourth pinned layer is a synthetic pinned layer including a first ferromagnetic layer and a second ferromagnetic layer separated by a nonmagnetic layer, the first ferromagnetic layer and the second ferromagnetic layer being antiferromagnetically coupled.

19. The magnetic element of claim 12 wherein the spin tunneling junction is a dual spin tunneling junction further including a second barrier layer and a sixth pinned layer, the first free layer residing between the first pinned layer and the sixth pinned layer, the second barrier layer residing between the first free layer and the sixth pinned layer, the sixth pinned layer being ferromagnetic and having a sixth pinned layer magnetization pinned in a sixth direction, the barrier layer being an insulator and having a first thickness that allow tunneling through the barrier layer.

20. A magnetic memory device comprising:
a plurality of magnetic cells including a plurality of magnetic elements, each of the plurality of magnetic elements including a spin tunneling structure and a spin valve structure, the spin tunneling structure including a first pinned layer, a barrier layer, a first free layer, a first nonmagnetic spacer layer, and a second pinned layer, the first pinned layer being ferromagnetic and having a first pinned layer magnetization, the first pinned layer magnetization being pinned in a first direction, the barrier layer being an insulator and having a thickness that allows tunneling through the barrier layer, the barrier layer being disposed between the first pinned layer and the first free layer, the first free layer being ferromagnetic and having a first free layer magnetization, the first nonmagnetic spacer layer being conductive and disposed between the second pinned layer and the first free layer, the second pinned layer being ferromagnetic and having a second pinned layer magnetization pinned in a second direction, the spin valve structure having a third pinned layer, a second nonmagnetic spacer layer and a second free layer, the third pinned layer being ferromagnetic and having a third pinned layer magnetization, the third pinned layer magnetization being pinned in a third direction, the second free layer being ferromagnetic and having a second free layer magnetization, the second nonmagnetic spacer layer being conductive and residing between the second free layer and the second pinned layer) the first free layer and the second free layer being disposed such that the first free layer and the second free layer are magnetostatically coupled, the magnetic element is configured to allow the first and/or second free layer magnetization to change direction due to spin transfer when a write current is passed through the magnetic element;
a plurality of row lines coupled to the plurality of magnetic cells; and
a plurality of column lines coupled with the plurality of cells, the plurality of row lines and the plurality of column lines for selecting a portion of the plurality of magnetic cells for reading and writing.

21. The magnetic memory device of claim 20 wherein each of the plurality of magnetic elements further includes a separation layer residing between the first free layer of the spin tunneling structure and the second free layer of the spin valve, the separation layer being configured to allow the first free layer and the second free layer to be magnetostatically coupled.

22. The magnetic memory device of claim 20 wherein the spin valve is a dual spin valve and further includes a fourth pinned layer and a third nonmagnetic spacer layer disposed between the second free layer and the fourth pinned layer, the second free layer being disposed between the third pinned layer and the fourth pinned layer the fourth pinned layer being magnetic and having a fourth pinned layer magnetization pinned in a fourth direction.

23. The magnetic memory device of claim 22 wherein each of the plurality of magnetic elements further includes:
a second dual spin valve including a fifth pinned layer, a fourth nonmagnetic spacer layer, a third free layer, a fifth nonmagnetic spacer layer, and a sixth pinned layer, the fourth nonmagnetic spacer residing between the fifth pinned layer and the third free layer, the third free layer residing between the fifth pinned layer and the sixth pinned layer, the fifth nonmagnetic spacer layer residing between the third free layer and the sixth pinned layer, the fifth pinned layer having a fifth pinned layer magnetization pinned in a fifth direction, the sixth pinned layer having a sixth pinned layer magnetization pinned in a sixth direction, the third free layer having a third free layer magnetization, the first free layer and the third free layer being disposed such that the first free layer and the third free layer are magnetostatically coupled.

24. A magnetic memory device comprising:
a plurality of magnetic cells including a plurality of magnetic elements, each of the plurality of magnetic elements including a spin tunneling junction, a first dual spin valve and a second dual spin valve, the spin tunneling junction having a first pinned layer, a barrier layer, and a first free layer, the barrier layer residing between the first pinned layer and the first free layer, the first pinned layer being ferromagnetic and having a first pinned layer magnetization pinned in a first direction, the first free layer being ferromagnetic and having a first free layer magnetization, the barrier layer being an insulator and having a first thickness that allow tunneling through the barrier layer, the first dual spin valve having a second pinned layer, a first nonmagnetic spacer layer, a second free layer, a second nonmagnetic spacer layer and a third pinned layer, the second pinned layer residing between the second free layer and the first free layer, the first nonmagnetic spacer residing between the second pinned layer and the second free layer, the second free layer residing between the second pinned layer and the third pinned layer, the second nonmagnetic spacer residing between the second free layer and the third pinned layer, the second pinned layer being ferromagnetic and having a second pinned layer magnetization pinned in a second direction, the third pinned layer being ferromagnetic and having a third pinned layer magnetization pinned in a third direction, the second free layer being ferromagnetic and having a second free layer magnetization, the first free layer and the second free layer being magnetostatically coupled, the first nonmagnetic spacer layer being conductive, the second dual spin valve having a fourth pinned layer, a third nonmagnetic spacer layer, a third free layer, a fourth nonmagnetic spacer layer and a fifth pinned layer, the fourth pinned layer residing between the first free layer and the third free layer, the third nonmagnetic spacer residing between the fourth pinned layer and the third free layer, the fourth nonmagnetic spacer residing between the third free layer and the fifth pinned layer, the fourth pinned layer being ferromagnetic and having a fourth pinned layer magnetization pinned in a fourth direction, the fifth pinned layer being ferromagnetic and having a fifth pinned layer magnetization pinned in a fifth direction, the third free layer being ferromagnetic and having a third free layer magnetization, the first free layer and the third free layer being magnetostatically coupled, wherein the magnetic element is configured to allow the second free layer magnetization and the third free layer magnetization to change direction due to spin transfer when a write current is passed through the magnetic element;
a plurality of row lines coupled to the plurality of magnetic cells; and
a plurality of column hues coupled with the plurality of cells, the plurality of row lines and the plurality of column lines for selecting a portion of the plurality of magnetic cells for reading and writing.

25. The magnetic memory device of claim 24 wherein each of the plurality of elements further includes a separation layer residing between the first free layer of the spin tunneling junction and the second pinned layer of the first dual spin valve, the separation layer being configured to allow the first free layer and the second free layer to be magnetostatically coupled.

26. The magnetic element of claim 24 wherein the spin tunneling junction is a dual spin tunneling junction further including a second barrier layer and a sixth pinned layer, the first free layer residing between the first pinned layer and the sixth pinned layer, the second barrier layer residing between the first free layer and the sixth pinned layer, the sixth pinned layer being ferromagnetic and having a sixth pinned layer magnetization pinned in a sixth direction, the barrier layer being an insulator and having a first thickness that allow tunneling through the barrier layer.

27. A method for providing magnetic element comprising the steps of:
 (a) providing a spin tunneling structure including a first pinned layer, a barrier layer, a first free layer, a first nonmagnetic spacer layer and a second pinned layer, the first pinned layer being ferromagnetic and having a first pinned layer magnetization, the first pinned layer magnetization being pinned in a first direction, the barrier layer being an insulator and having a thickness that allows tunneling through the barrier layer, the barrier layer being disposed between the first pinned layer and the first free layer, the first free layer being ferromagnetic and having a first free layer magnetization, the first nonmagnetic spacer layer being conductive and disposed between the second pinned layer and the first free layer, the second pinned layer being ferromagnetic and having a second pinned layer magnetization pinned in a second direction; and
 (b) providing a spin valve structure having a third pinned layer, a second nonmagnetic spacer layer and a second free layer, the third pinned layer being ferromagnetic and having a third pinned layer magnetization, the third pinned layer magnetization being pinned in a third direction, the second free layer being ferromagnetic and having a second free layer magnetization, the second nonmagnetic spacer layer being conductive and residing between the second free layer and the second pinned layer, the first free layer and the second free layer being disposed such that the first free layer and the second free layer are magnetostatically coupled;
 wherein the magnetic element is configured to allow the first and/or second free layer magnetization to change direction due to spin transfer when a write current is passed through the magnetic element.

28. A The method of claim 27 further comprising the step of:
 (c) providing a separation layer residing between the first free layer of the spin tunneling structure and the second free layer of the spin valve, the separation layer being configured to allow the first free layer and the second free layer to be magnetostatically coupled.

29. The method of claim 27 wherein the spin valve is a dual spin valve and wherein the spin valve providing step (b) further includes the steps of:
 (b1) providing a fourth pinned layer; and
 (b2) providing a third nonmagnetic spacer layer disposed between the second free layer and the fourth pinned layer, the second free layer being disposed between the third pinned layer and the fourth pinned layer, the fourth pinned layer being magnetic and having a fourth pinned layer magnetization pinned in a fourth direction.

30. The method of claim 29 further comprising:
 (c) providing a second dual spin valve including a fifth pinned layer, a fourth nonmagnetic spacer layer, a third free layer, a fifth nonmagnetic spacer layer, and a sixth pinned layer, the fourth nonmagnetic spacer residing between the fifth pinned layer and the third free layer, the third free layer residing between the fifth pinned layer and the sixth pinned layer, the fifth nonmagnetic spacer layer residing between the third free layer and the sixth pinned layer, the fifth pinned layer having a fifth pinned layer magnetization pinned in a fifth direction, the sixth pinned layer having a sixth pinned layer magnetization pinned in a sixth direction, the third free layer having a third free layer magnetization, the first free layer and the third free layer being disposed such that the first free layer and the third free layer are magnetostatically coupled.

31. A method for providing a magnetic element comprising the steps of:
 (a) providing a spin tunneling junction having a first pinned layer, a barrier layer, and a first free layer, the barrier layer residing between the first pinned layer and the first free layer, the first pinned layer being ferromagnetic and having a first pinned layer magnetization pinned in a first direction, the second pinned layer being ferromagnetic and having a second pinned layer magnetization pinned in a second direction, the first free layer being ferromagnetic and having a first free layer magnetization, the barrier layer being an insulator and having a first thickness that allow tunneling through the barrier layer;

(b) providing a first dual spin valve having a second pinned layer, a first nonmagnetic spacer layer, a second free layer, a second nonmagnetic spacer layer and a third pinned layer, the second pinned layer residing between the second free layer and the first free layer, the first nonmagnetic spacer residing between the second pinned layer and the second free layer, the second free layer residing between the second pinned layer and the third pinned layer, the second nonmagnetic spacer residing between the second free layer and the third pinned layer, the second pinned layer being ferromagnetic and having a second pinned layer magnetization pinned in a second direction, the third pinned layer being ferromagnetic and having a third pinned layer magnetization pinned in a third direction, the second free layer being ferromagnetic and having a second free layer magnetization, the first free layer and the second free layer being magnetostatically coupled, the first nonmagnetic spacer layer being conductive;

(c) providing a second dual spin valve having a fourth pinned layer, a third nonmagnetic spacer layer, a third free layer, a fourth nonmagnetic spacer layer and a fifth pinned layer, the fourth pinned layer residing between the first free layer and the third free layer, the third nonmagnetic spacer residing between the fourth pinned layer and the third free layer, the fourth nonmagnetic spacer residing between the third free layer and the fifth pinned layer, the fourth pinned layer being ferromagnetic and having a fourth pinned layer magnetization pinned in a fourth direction, the fifth pinned layer being ferromagnetic and having a fifth pinned layer magnetization pinned in a fifth direction, the third free layer being ferromagnetic and having a third free layer magnetization, the first free layer and the third free layer being magnetostatically coupled, wherein the magnetic element is configured to allow the second free layer magnetization to change direction due to spin transfer when a write current is passed through the magnetic element.

32. The method of claim 31 further comprising the step of:

(d) providing a separation layer residing between the first free layer of the spin tunneling junction and the second pinned layer of the first dual spin valve, the separation layer being configured to allow the first free layer and the second free layer to be magnetostatically coupled.

33. The method of claim 32 wherein the spin tunneling junction is a dual spin tunneling junction and wherein the spin tunneling junction providing step (a) further includes the step of:

(a1) providing a second barrier layer;

(a2) providing a sixth pinned layer, the second barrier layer residing between the first free layer and the sixth pinned layer, the first free layer residing between the first pinned layer and the sixth pinned layer, the sixth pinned layer being ferromagnetic and having a sixth pinned layer magnetization pinned in a sixth direction, the barrier layer being an insulator and having a first thickness that allow tunneling through the barrier layer.

* * * * *